(12) United States Patent
Fletcher

(10) Patent No.: US 6,329,857 B1
(45) Date of Patent: Dec. 11, 2001

(54) APPARATUS, METHOD AND SYSTEM FOR A LOGIC ARRANGEMENT HAVING MUTUALLY EXCLUSIVE OUTPUTS CONTROLLED BY BUFFERING CROSS-COUPLED DEVICES

(75) Inventor: Thomas D. Fletcher, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/476,157

(22) Filed: Dec. 30, 1999

(51) Int. Cl.⁷ .................................................. H03K 3/037
(52) U.S. Cl. ............................................ 327/215; 327/57
(58) Field of Search ............................... 327/51–57, 333, 327/199, 215; 365/205, 207

(56) References Cited

U.S. PATENT DOCUMENTS

| 5,453,708 |   | 9/1995  | Gupta et al. ............................. 326/98 |
|-----------|---|---------|---------------------------------------------------|
| 5,504,709 | * | 4/1996  | Yabe et al. ......................... 365/189.05  |
| 5,537,068 |   | 7/1996  | Konno ................................... 327/115  |
| 5,619,466 | * | 4/1997  | McClure .............................. 365/207     |
| 5,654,933 | * | 8/1997  | McLaury .............................. 365/207     |
| 5,828,250 |   | 10/1998 | Konno ................................... 327/116  |
| 5,880,608 |   | 3/1999  | Mehta et al. ........................... 326/93    |
| 5,929,659 | * | 7/1999  | Pantelakis et al. ..................... 327/57     |
| 5,942,917 |   | 8/1999  | Chappell et al. ..................... 326/121      |

* cited by examiner

*Primary Examiner*—Toan Tran
(74) *Attorney, Agent, or Firm*—Kenyon & Kenyon

(57) ABSTRACT

An apparatus for buffering at least one output signal of a sense-amplifier arrangement for use with a first output and at least a second output of a logic circuit, the first output and the at least a second output being mutually exclusive, the apparatus including a cross-coupled transistor arrangement.

29 Claims, 12 Drawing Sheets

LVS carry skip ALU circuit topology

LVS scheduler or PLA circuit topology

APPARATUS, METHOD AND SYSTEM FOR A LOGIC ARRANGEMENT HAVING MUTUALLY EXCLUSIVE OUTPUTS CONTROLLED BY BUFFERING CROSS-COUPLED DEVICES

FIELD OF THE INVENTION

The present invention concerns an apparatus, method and system for a logic arrangement having mutually exclusive outputs controlled by buffering cross-coupled devices. Such an arrangement may be used, for example, with various pulse passgate topologies or with a controllable pulse-clock-delay arrangement to control functional race margins in a logic data path.

BACKGROUND INFORMATION

Logic arrangements that use pulse clocks may be useful in certain applications. An example of the use of pulse clocks in a logic arrangement, which is a domino logic arrangement, and is shown, for example, in commonly assigned U.S. Pat. No. 5,880,608, which concerns a method of interfacing a static logic arrangement to a dynamic domino logic arrangement. In particular, a static logic arrangement is connected to one input of a domino evaluation logic arrangement. The domino evaluation logic arrangement only operates during a relatively brief time interval or window, which occurs while an evaluation control arrangement is in its "on" state. Since the input to the domino gate need only be stable during this time interval or window, the output of the static logic arrangement does not have to be latched. Since advanced micro-architectures may require a number of "pipeline" stages and a number of corresponding data latches, which may consume integrated circuit power consumption and area, to interface the various pipeline stages, the foregoing pulse domino logic arrangement is intended to reduce the number of such data latches.

Another example of an arrangement using pulsed clocks may be found in commonly assigned U.S. Pat. No. 5,942,917, which is entitled "High Speed Ratioed CMOS Logic Structures For A Pulsed Input Environment." In particular, this patent concerns a complementary-metal-oxide-semiconductor field-effect-transistor (CMOSFET) logic structure that is adapted to receive pulsed active input signals and to provide a logical output with a relatively small switching delay. The pull-down transistors and complementary pull-down transistors are ratioed so that the default logical output level remains relatively close to a nominal level when the logic structure sinks or sources a direct current. Also, when the pulsed input signals are inactive, no direct current path is enabled. In an exemplary embodiment, a logic structure, which has PMOSFET pull-up devices and NMOSFET pull-down devices, receives active low pulsed input signals and produces a high logic output signal when all the input signals are at a low logic level. When at least one but not all of the input signals are low, the logic structure provides a low logic output signal and sinks a direct current. When all of the input signals are at a high logic level, the logic structure produces a low logic output signal and no direct current paths are switched on.

As regards passgate logic, passgate switching networks have been used to implement relaying logic by using passgate transistors, such as MOSFET devices, and standard clocking arrangements. In particular, such switch networks may use a plurality of passgate transistors in a chain to connect conditionally two nodes, such as an input node and an output node, together. That is, passgate switching networks may be used when the logic function may be considered to consist of signals that are to be relayed or steered conditionally through the switching network.

Low voltage swing ("low-voltage-swing" or "LVS") logic arrangements may provide a faster data throughput than full voltage swing ("full-voltage-swing" or "FS") logic arrangements depending on the specifics of the application. In a full-voltage-swing logic arrangement, a true input data signal must transition between a full high logic level, such as a supply voltage (Vcc or Vdd), and a full low logic level, such as a relative ground (true ground or Vss), before the full-voltage-swing logic arrangement may provide a valid data output signal. By contrast, a low-voltage-swing logic arrangement may provide valid data output signals based on a difference in potential between a pair of complementary data input signals. This potential difference may be relatively small, and may be, for example, on the order of about 100 millivolts.

More specifically, low-voltage-swing logic arrangements carry valid data signals on a pair of data "wires". A first data wire is used to carry a true value of the valid data signal and a second data wire is used to carry a complementary value of the same valid data signal. In a two-phase clocking arrangement, during a first clocking or pre-charging phase, both the data wires are pre-charged to a predetermined or pre-charge potential. At this point, the data wires do not contain any valid data or information. During a second clocking or evaluating phase, the potentials on the two wires may diverge in response to the information content of an input data signal. In particular, one data wire "evaluates" by transitioning toward an evaluation potential and the second data wire remains at the pre-charge potential, the low-voltage-swing logic arrangement then provides a valid data output signal based on the potential or voltage difference between the valid true and complementary data input signals. After the second clocking or evaluating phase, both data wires are again pre-charged to their pre-charge potential during a succeeding first clocking or pre-charge phase.

Accordingly, low-voltage-swing logic arrangements may operate faster than corresponding full-voltage-swing logic arrangements so as to provide an improved level of valid data throughput. Also, since low-voltage-swing logic arrangements do not require full-voltage-swing transitions to provide valid data output signals, the signal voltages used in a low-voltage-swing logic arrangement may be lower than corresponding full-voltage-swing logic arrangements. As a result, the use of low-voltage swing logic arrangements may provide reduced power consumption, as compared to a full-voltage-swing logic arrangement, in an integrated circuit arrangement, such as, for example, a microprocessor, or any other suitably appropriate semiconductor-based logic arrangement.

In certain integrated circuit arrangements, including, for example, microprocessors and any other suitably appropriate logic arrangements, one or more fixed delay arrangements or devices may be provided to better ensure that a clock signal does not arrive before the data in a data path of a particular logic arrangement. In some self-timed circuits, for example, one or more fixed delay devices may be arranged in the clock path to delay the clock signal with respect to the data signal in the corresponding data path of some logic arrangement. The clock signal may, for example, be delayed by arranging fixed gate delays, such as MOSFET-based inverter-buffer devices in the clock signal path. In this way, a suitably appropriate "race margin" may be added to the logic arrangement to account for any timing variations between a clock signal in the clock signal path and a valid data signal in the corresponding data path of the logic arrangement, such as a data path in a complementary or differential domino logic arrangement. Such a race margin may, for example, be on the order of about five (5) sigma variations depending on the particular application, the semiconductor materials used and the gate device structure used in the logic arrangement to meet the yield requirements for a product.

An example of the use of fixed delay devices in a clock signal path of a logic arrangement may be found in commonly assigned U.S. Pat. No. 5,453,708, in which a clocking scheme provides for an improved latching of an output from a domino logic arrangement by delaying a pre-charging of a data node in the domino logic arrangement. In particular, the pre-charging delay is achieved by introducing the delay in the clocking circuit arrangement, which activates the pre-charging of the domino node. No delay is introduced in the data path so that the evaluation and transmission of the data signal is not delayed. Thus, during a first phase of a clocking cycle, the domino node is pre-charged to a predetermined logic state. Also, during this pre-charge phase, an input latch couples an input data signal to the domino logic arrangement. During a second phase of the clocking cycle, the domino logic arrangement performs a logic operation based on the input data signal, and an output latch latches the logic state of the domino output for transmission from the output latch. Subsequently, when the pre-charging phase begins again, the pre-charging of the domino node is delayed by a fixed time until the output latch is completely de-activated so as to better ensure that the pre-charge potential is not latched out so as to corrupt the data being output.

Also, delay lock loop ("DLL") circuits and techniques may be used in an integrated circuit arrangement to implement a faster reference clock signal that is based on a slower base or external clock signal, which is sourced externally to the integrated circuit arrangement. The faster reference clock may then be provided to different functional unit blocks of the integrated circuit arrangement. Examples of such an arrangement may be found in commonly assigned U.S. Pat. Nos. 5,537,068 and 5,828,250. It is believed that such an arrangement may conserve power by providing clock startup and stop times, which may be faster than that provided by phase-locked-loop ("PLL") techniques, which may also be used to provide a reference clock signal based on an external clock signal.

Additionally, differential cascode voltage structures have been used in which the gate of a first pull-up PMOSFET device, which is coupled to an NMOSFET device-based true input pull-down logic network, is coupled to a complementary output of an NMOSFET device-based complementary input pull-down logic network and to a drain of a second pull-up up PMOSFET device. The differential cascode voltage structure is further defined by having a gate of the second pull-up PMOSFET device, which is coupled to the NMOSFET device-based complementary input pull-down logic network, that is coupled to a true output of the NMOSFET device-based true input pull-down logic network and to a drain of the second pull-up PMOSFET device, and in which the sources of the first and second PMOSFET pull-up devices are coupled to a supply voltage and the logic networks are coupled to ground. In particular, in such differential cascode voltage structures, exactly one of either the true or complementary NMOSFET device-based pull-down logic networks will complete a path to the power supply. Additionally, the NMOSFET device-based pull-down network will lower the output voltage, which will turn on the other pull-up PMOSFET device and which will also turn off the pull-up PMOSFET device that is being driven to its low logic level.

As regards all of the above, it is not believed that any of these systems reflect the advantages, apparatuses, methods, structures or topologies of the present inventions, which are discussed below.

SUMMARY OF THE INVENTION

One exemplary embodiment of the present invention is directed to providing an apparatus for buffering at least one output signal of a sense-amplifier arrangement for use with a first output and at least a second output of a logic circuit, the first output and the at least a second output being mutually exclusive, the apparatus including a cross-coupled transistor arrangement.

Still another exemplary embodiment of the present invention is directed to providing a buffer apparatus for use with a first output, a second output and at least a third output of a logic circuit, in which the first output, the second output and the at least a third output are mutually exclusive, the apparatus including a first transistor having a first gate and a first terminal, a second transistor having a second gate and a second terminal, a third transistor having a third gate and a third terminal, a fourth transistor having a fourth gate and a fourth terminal, a fifth transistor having a fifth gate and a fifth terminal, at least a sixth transistor having a sixth gate and a sixth terminal, wherein the first output is coupled to the first terminal and the second terminal and the fourth gate and the sixth gate, the second output is coupled to the fifth gate and the third terminal and the fourth terminal, and the third output is coupled to the first gate and the third gate and the fifth terminal and the sixth terminal.

Yet another exemplary embodiment of the present invention is directed to providing a buffer apparatus for use with a first output and at least a second output of a logic circuit, the first output and the at least a second output being mutually exclusive, the apparatus including a cross-coupled transistor arrangement, wherein the cross-coupled transistor arrangement includes a first transistor having a first gate and a first terminal, at least a second transistor having a second gate and a second terminal, wherein the first gate and the second terminal are adapted to be coupled to the first output, and the first terminal and the second gate are adapted to be coupled to the at least a second output.

Still another exemplary embodiment of the present invention is directed to providing a buffer apparatus for use with a first output and at least a second output of a logic circuit, the first output and the at least a second output being mutually exclusive, the buffer apparatus including a cross-coupled MOSFET arrangement, wherein the logic circuit receives at least one input from at least one sense-amplifier arrangement.

Yet another exemplary embodiment of the present invention is directed to providing a buffer and gain system including a sense-amplifier arrangement, a logic gate loading arrangement, a logic arrangement having a first output and at least a second output, each of the outputs being mutually exclusive outputs, the logic arrangement being coupled between the sense-amplifier arrangement and the logic gate loading arrangement, a first transistor having a first gate and a first terminal and at least a second transistor having a second gate and a second terminal, wherein the first gate and the second terminal are adapted to be coupled to the first output, and the first terminal and the second gate are adapted to be coupled to the at least a second output.

Another exemplary embodiment of the present invention is directed to providing a pulse-passgate-logic system including a pulse clock circuit arrangement that provides a pulse clock having a phase, at least another pulse clock circuit arrangement that provides at least another pulse clock having at least another phase, at least one passgate logic arrangement that is coupled to one of the pulse clock circuit arrangement and the at least another pulse clock circuit arrangement, and at least one sense-amplifier arrangement that is coupled to the at least one passgate logic arrangement and to one of the pulse clock circuit arrangement and the at least another pulse clock circuit arrangement.

Yet another exemplary embodiment of the present invention is directed to providing a pulse-passgate-logic circuit arrangement including a variable width pulse clock circuit arrangement that provides a pulse clock having a phase, at least another pulse clock circuit arrangement that provides at least another pulse clock having at least another phase, wherein the at least another pulse clock circuit arrangement is coupled to the pulse clock circuit arrangement, at least one passgate logic circuit arrangement that is coupled to at least one of the pulse clock circuit arrangement and the at least another pulse clock circuit arrangement, at least one domino logic arrangement that is coupled to the at least one passgate logic arrangement, at least one sense-amplifier arrangement that is coupled to one of the at least one passgate logic arrangement and the at least one domino logic arrangement, and that is coupled to one of the pulse clock circuit arrangement and the at least another pulse clock circuit arrangement.

Still another exemplary embodiment of the present invention is directed to providing a pulse-passgate-logic system including means for providing a pulse clock having a phase, at least another means for providing at least another pulse clock having at least another phase, at least one passgate logic arrangement that is coupled to one of the means for providing a pulse clock and to the at least another means for providing at least another pulse clock, and at least one sense-amplifier means that is coupled to the at least one passgate logic arrangement and to one of the means for providing a pulse clock and to the at least another means for providing at least another pulse clock.

Another exemplary embodiment of the present invention is directed to providing a controllable pulse-clock-delay apparatus for use with an integrated circuit, the controllable pulse-clock-delay apparatus including an input pulse clock terminal that is adapted to receive an input pulse clock, an output pulse clock terminal, a controllable delay arrangement that is coupled to the input pulse clock terminal, and that is adapted to output an output pulse clock at the output pulse clock terminal, and a feedback arrangement coupling the output pulse clock to the controllable delay arrangement so that another output pulse clock is based on the input pulse clock and the output pulse clock.

Another exemplary embodiment of the present invention is directed to providing a controllable pulse-clock-delay apparatus for use with an integrated circuit having at least one operating unit arrangement, the controllable pulse-clock-delay apparatus including a control arrangement, wherein the control arrangement includes a stretch control line, a first delay control line and at least a second delay control line, an input pulse clock terminal that is adapted to receive an input pulse clock, an output pulse clock terminal, a controllable delay arrangement that is coupled to the control arrangement, and that is adapted to output an output pulse clock at the output pulse clock terminal, and a feedback arrangement coupling the output pulse clock to the controllable delay arrangement so that a phase of another output pulse clock is based on the input pulse clock and the output pulse clock, wherein the feedback arrangement includes a plurality of controllable pulse-clock-delay devices.

Still another exemplary embodiment of the present invention is directed to providing a controllable pulse-clock-delay apparatus for use with an integrated circuit, the controllable pulse-clock-delay apparatus including an input pulse clock terminal that is adapted to receive an input pulse clock, an output pulse clock terminal, means for controllably delaying the input pulse clock and for providing an output pulse clock to the output pulse clock terminal, and means for feeding back the output pulse clock to the controllable delay arrangement so that another output pulse clock is based on the input pulse clock and the output pulse clock.

Yet another exemplary embodiment of the present invention is directed to providing a method for providing a controllably delayed pulse-clock for use with an integrated circuit, the method including the steps of receiving an input pulse clock, controllably delaying the input pulse clock and providing an output pulse clock based on the at least one control signal, the input pulse clock and another output pulse clock, and feeding back the output pulse clock, which is adapted to become the another output pulse clock, to the controllable delaying step so that the output pulse clock is based on the input pulse clock and the another output pulse clock.

DETAILED DESCRIPTION

It is believed that certain suitably appropriate topologies may combine pulse-passgate-logic, which uses a suitably appropriate pulse clock arrangement, and low-voltage-swing and/or full-voltage-swing logic arrangements to provide significant performance advantages over at least certain existing systems. It is also believed that the pulse-passgate-logic topologies of the present apparatus, method and system may facilitate the use of zero threshold-voltage transistor devices (such as MOSFET devices, including both NMOSFET and PMOSFET devices) to increase circuit performance or to improve the voltage scaling characteristics of such transistor devices in integrated circuits.

In particular, the pulse-passgate-logic topologies of the present system use a "pseudo" two-phase pulse clock system. In the pseudo two-phase pulse clock system of the present system, a reset phase or a first phase is used to rest all the intermediate data nodes of a logic arrangement to the power supply rail (namely, Vcc or Vdd), and a pulsed evaluation phase or a second phase is used to evaluate these intermediate data nodes by propagating the corresponding nodal signals through a pulse-passgate-logic arrangement. In particular, it is believed that the present pulse-passgate logic arrangements, which use local controllable pulse-clock-delay systems and passgate transistors (such as MOSFET devices), may provide various performance advantages. Such an arrangement is also believed to provide certain advantages when front-end pulse-passgate-logic arrangements are coupled with differential domino logic arrangements, but which may also be full-swing domino logic arrangements and any other suitably appropriate logic arrangements.

Figure 4:
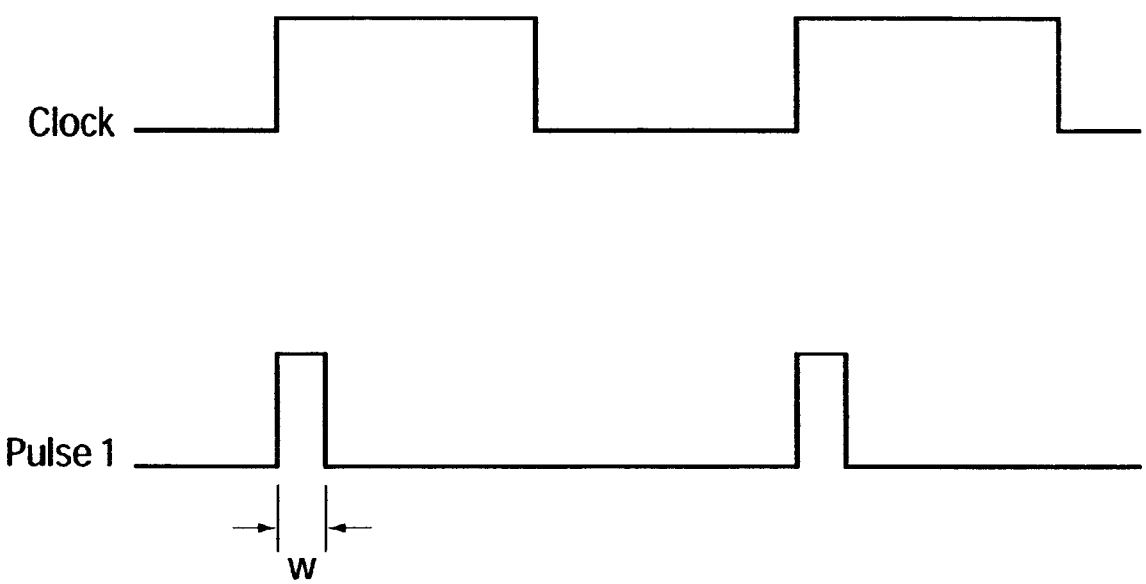
FIG. 4 shows a reference clock signal and a corresponding pulse clock signal.

The present system uses local self-timed or pulse clock systems, which may be local clock buffers or local controllable pulse-clock-delay arrangements. In such pulse clock systems, the phase of a pulse clock signal is not changed when the frequency changes in an external or reference non-pulse clock. In particular, a pulse clock is triggered off of either a rising clock edge or a falling clock edge of the external or reference clock (or other input clock). Accordingly, the pulse clock signal does not vary with frequency changes in the reference clock. An example of a pulse clock signal is shown as a PULSE 1 clock signal in FIG. 4. As shown, the time interval that each pulse remains high is the pulse width. Also, as shown, the PULSE 1 clock signal may be generated when an external or reference CLOCK signal transitions from a low logic level or state (logic 0) to a high logic level or state (logic 1) or, alternatively, from a high logic level to a low logic level. In this way, both the rising and falling edges of each pulse in the PULSE 1 clock signal are generated by a single rising clock edge or a single falling clock edge of the external or reference CLOCK signal. As a result, using a pulse clock system should reduce the time during which the clocked logic circuit is in a "contending" state, and therefore should reduce power consumption in an integrated circuit.

An example of a pulse clock generating arrangement is the variable width pulse clock generator of commonly assigned U.S. patent application Ser. No. 09/159,548, entitled "Variable Width Pulse Generator," which was filed on Sep. 24, 1998, and which is a continuation-in-part of commonly assigned U.S patent application Ser. No. 09/002, 148, entitled "High Gain Pulse Generator Circuit For Clocking." A variable width pulse clock generator may be useful if, for example, different functional unit blocks in the integrated circuit require pulse clocks that have different pulse widths. By providing a variable pulse width generator arrangement with each of the one or more functional unit blocks, which may require such a local variable pulse clock generator arrangement, this should simplify the design of the integrated circuit since the same variable width pulse clock generator arrangement may be used throughout the integrated circuit for different logic operations or tasks at each of the various functional unit blocks. In this regard, the variable width pulse clock generator may include variable width pulse clock generator control lines, which may be used by a system designer to adjust the width of the pulse clock to conform to the particular clocking requirements of the functional logic or unit block with which it is associated, or to aid in the testing of a functional or unit block in the integrated circuit.

In the integrated circuit topologies of the present system, local controllable pulse-clock-delay arrangements or systems are used, where appropriate, with each functional unit block in an integrated circuit. In particular, the controllable pulse-clock-delay system may be used to "stretch" controllably the pulse-clock-delay based on an input clock frequency so that a "speed" condition or path, rather than a "race" condition path, is provided in the data path of a particular logic arrangement. By providing a speed path in the logic arrangement, the corresponding sigma variation may be lowered as compared to the sigma variation associated with a race path. In particular, whereas the race margin in a race path may, for example, may be on the order of about five (5) sigma variations, the corresponding margin in a speed path may be on the order of about two (2) sigma variations. In this regard, for example, if the five sigma margin is on the order of about 250 picoseconds and the two sigma margin is on the order of about 100 picoseconds, then the semiconductor chip system may save a processing time that is on the order of about 150 picoseconds. Accordingly, this may reduce processing delays or power consumption, and it is believed that the integrated circuit operations and tasks, which use such arrangements, may provide faster processing. This is because at least some portion of the clock inaccuracy margin may be eliminated or otherwise reduced.

In this regard, it is believed that certain suitably appropriate pulse-passgate-logic topologies, using a suitably appropriate pulse clock based system, as will be further discussed below, may provide significant performance advantages over at least certain existing systems. As discussed below, the pulsed-passgate-logic present system provide a "single cycle" logic family, in which the entire logic cycle is completed off of one clock edge of the input clock. That is, the data is effectively driven, evaluated and sampled off of one edge of the clock. Moreover, it is believed that such pulse-passgate-logic topologies may facilitate the use of zero threshold voltage transistor devices, including both NMOSFET and PMOSFET devices, to increase circuit performance or to provide better device voltage scaling characteristics. In particular, the pulse-passgate-logic topologies of the present system use a "pseudo" two-phase pulse clock system. In this two-phase pulse clock system, a reset phase or first phase is used to reset all the intermediate data nodes of a logic arrangement to the power rail (Vcc or Vdd), and a pulsed evaluation phase or second phase is used to evaluate these data nodes by propagating the nodal data signals through the passgate logic chain.

The exemplary pulse-passgate-logic topologies (and other topologies discussed below) may be low-voltage-swing logic arrangements and systems. These systems use dual power rails, namely the power supply rail (Vcc or Vdd) and the relative ground rail (true ground or Vss). Importantly, these systems should have symmetrical structure along the logic chain of the passgate logic arrangement. It is believed that in low-voltage-swing and pulse-passgate-logic systems, a symmetrical dual rail structure may help offset any coupling noise. This coupling noise may occur when a coupled dynamic or two-phase clocked sense-amplifier arrangement is "turned on" so as to sense the coupled data signals. In particular, to couple the differential data signals between the pulse-passgate-logic arrangement and some other logic arrangement, a dynamic or two-phase pulse clocked PMOSFET-device sense-amplifier ("SA") arrangement may be used to couple the data signals between the pulse-passgate-logic arrangement and the other logic arrangement, which may be, for example, a complementary or differential domino logic arrangement.

While the present system is discussed with respect to low-voltage-swing applications and logic arrangements, it is believed that the present pulse-passgate-logic techniques and topologies may also be used with fill-voltage-swing systems. In a full-voltage-swing application, the full-voltage-swing pulse-passgate-logic only uses a single voltage supply rail (Vcc). Accordingly, since the second evaluating phase is pulse clocked, the data signals may be obtained (at the end of the pulse clock signal) by PMOSFET-device "keeper" circuits coupled to the output nodes in full-voltage-swing logic arrangements. This should provide a more "robust" circuit arrangement. Additionally, the pulse-passgate-logic topologies of the present system may use either NMOSFET-based passgate logic chains or PMOSFET-based passgate logic chains depending on the particular requirements of an application. In particular, the intermediate data nodes are reset to their low logic state in NMOSFET-device based pulse-passgate-logic systems, whereas the intermediate data nodes are reset to their high logic state in PMOSFET-device based pulse-passgate-logic systems.

In each of the foregoing pulse-passgate-logic systems, there are also two pulse-passgate-logic classes. These pulse-passgate-logic classes include a "reset on" class, in which S the input gate of a passgate logic chain is on during the reset phase, and a "reset off" class, in which the input gate in the passgate logic chain is off during the reset phase. For the "reset on" class of pulse-passgate-logic system topologies, no reset devices should need to be coupled to the intermediate data nodes since the reset device, which is located at the beginning of the passgate logic chain, should reset all the intermediate data nodes. In contrast, however, for the "reset off" class of pulse-passgate-logic system topologies, reset devices should be coupled to the intermediate data nodes. This is because the MOSFPT devices in the passgate logic chain of this class are "turned off" during their reset phase.

Also, the pulse-passgate-logic topologies of the present system should better enable the use of zero threshold-voltage MOSFET devices. In particular, it is believed that since the present pulse-passgate-logic system topologies are dynamic or "pseudo" two-phase pulse clocked systems, in which the appropriate intermediate (or source and drain) nodes are set to either the relative ground (true ground or Vss) in the NMOSFET-device based pulse-passgate-logic systems or to the power supply (Vcc or Vdd) in the PMOSFET-device based pulse-passgate-logic systems, the zero threshold-voltage MOSFET devices may be more easily used in the pulse-passgate-logic arrangement. This is because these logic arrangements should not incur unacceptable levels of current leakage or noise. In other logic arrangements that do not use zero threshold-voltage MOSFET devices, there is leakage current even when the MOSFET device is off. But in the pulse-passgate-logic and low-voltage-swing topologies of the present system, there should be less or even no effective leakage current as compared to, for example, non-LVS domino logic arrangements. This is because the drains and the sources of the MOSFET devices of the present system are at the same voltage, namely, the supply voltage (Vcc or Vdd) for NMOSFET-device arrangements and relative ground (true ground or Vss) for PMOSFET-device arrangements. Also, by using zero threshold-voltage MOSFET devices, any resistor-capacitor delay of the MOSFET device should be lower because there should be increased operating currents, and this should provide faster operation of the MOSFET devices.

In short, it is believed that the present pulse-passgate-logic and low-voltage-swing topologies should facilitate the use of zero threshold-voltage MOSFET device technology, and this may provide increased integrated circuit performance or improved threshold-voltage ("Vt") scalability of such systems. Additionally, depending on the application, it may not be necessary to mix NMOSFET devices and PMOSFET devices using the pulse-passgate-logic and low-voltage-swing topologies of the present system, as compared to non-pulse-clock systems. As a result, depending on the particular application, this should provide a more compact circuit or a more area efficient circuit. Thus, unlike full-voltage-swing (non-differential) domino logic systems, which, it is believed, require an even number of logic stages, the low-voltage-swing and pulse-passgate-logic systems of the present system may use an odd number of passgate logic stages in the logic arrangement. It is believed that this may allow more convenient or flexible use of such systems in at least some high performance integrated circuits.

Figure 1:
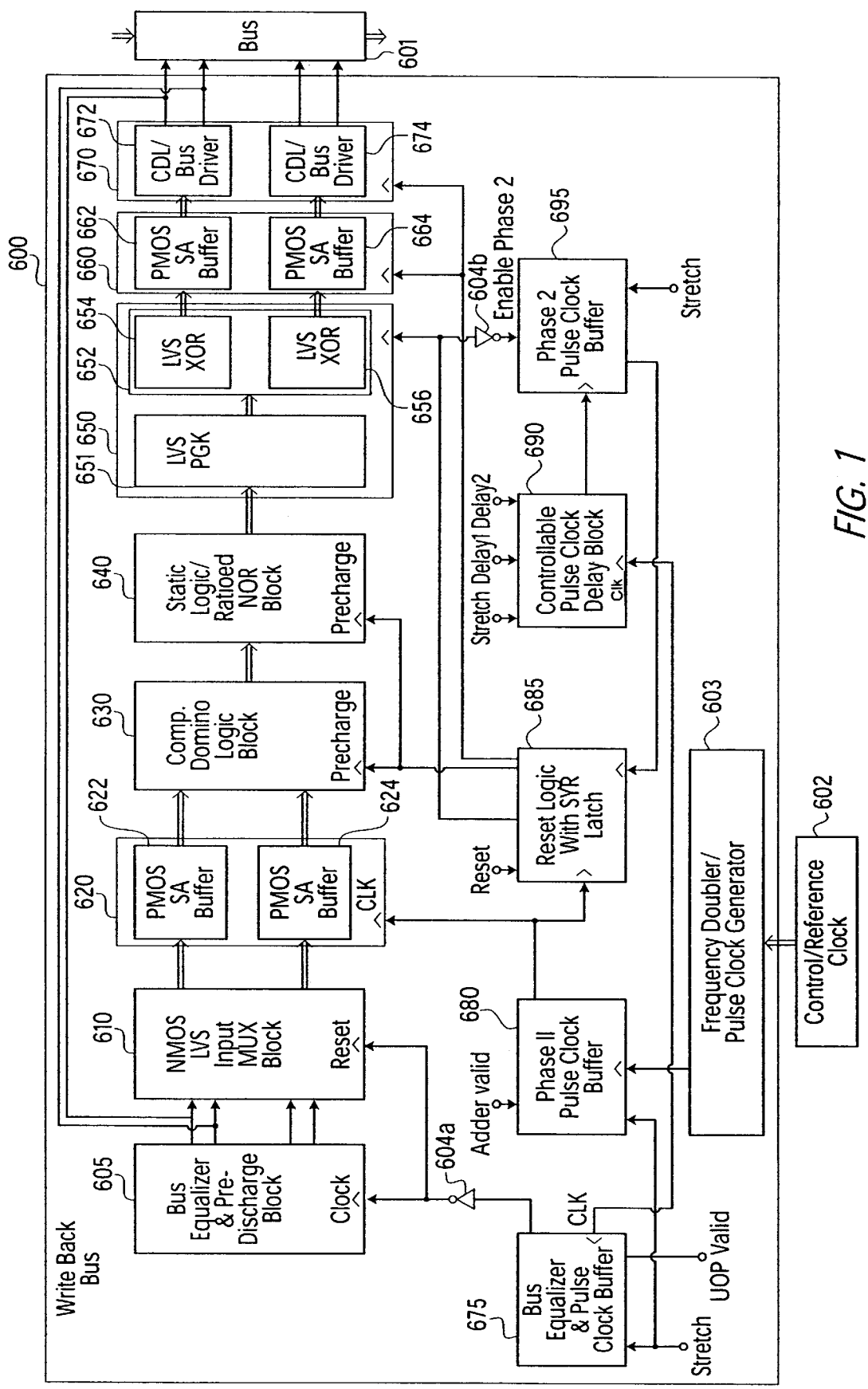
FIG. 1 shows a low-voltage-swing and pulse-passgate-logic schematic and topology for a carry-skip adder component of an arithmetic logic unit arrangement, which may have full-voltage-swing logic arrangements, that may be used with a microprocessor system and that includes the controllable pulse-clock-delay arrangement of FIG. 5 and FIG. 6.

As shown in FIG. 1, for example, a phase 1 ($\phi 1$) input pulse clock signal and a phase 2 ($\phi 2$) output pulse clock signal are provided locally to drive a reset line of a low-voltage-swing XOR logic block 652, the pre-charging of the complementary or differential domino logic block 630 in its output state and the pre-discharging of the complementary domino-logic and bus driver block 670, which is coupled to the output bus 601. Additionally, the $\phi 1$ input pulse clock and the $\phi 2$ output pulse clock should be tightly coupled to eliminate or at least reduce the timing margins between the reset and the evaluation phases (or periods). As discussed, any pulse clock circuit arrangements should be located relatively close to the functional unit blocks 430a, 430b, . . . , 430n of FIG. 9, that they are driving so as to better limit or reduce any MOSFET-device mismatch, which may occur because of spacing, supply voltage noise, temperature or other problems that may affect MOSFET-device performance.

Since the present system uses pulsed clocks, there should be no contention currents in any ratioed logic gates, such as ratioed MOSFET arrangements, when the pulse clocks are "stopped" in their reset phase. In this way, all the nodes in any low-voltage-swing logic arrangements may be discharged to relative ground (true ground or Vss) so that there are no floating intermediate nodes, and any leakage current from the supply (Vcc or Vdd) to relative ground (true ground or Vss) should be "eliminated" or reduced. As discussed, this should better allow for lower or "zero" threshold-voltage NMOSFET-devices to be used in the low-voltage-swing logic arrangements which should limit current leakage and which should better ensure scalability of the integrated circuit design with respect to the threshold voltages of the MOSFET-devices that may be used.

In particular, the ratioed PMOSFET-device sense-amplifier buffer arrangements 620 and 660 should reduce the "clock to output" delay. Also, when the $\phi 2$ output pulse clock is "stopped" in its reset phase, the PMOSFET-device sense-amplifier buffer arrangement 660 is held in its pre-charge state so that any direct current leakage should be "eliminated" or at least reduced. An N-well bias control may also be provided to allow forward biasing of the "well to source" for the differential PMOSFET-device pair in the PMOSFET-device sense-amplifier arrangements 620 and 660 so as to reduce any offset voltage $V_{offset}$. The use of pulse-clocked and ratioed PMOSFET-device sense-amplifier buffer arrangements 620 and 660 should provide faster operation than certain latch devices.

The low-voltage-swing and pulse-passgate-logic arrangements of the present method and system may also be used to perform more complex operations with fewer MOSFET devices. For example, larger numbers of MOSFET devices may be used in series for logic arrangements, such as domino-logic arrangements. Additionally, when signals must be driven relatively "long distances" in an integrated circuit, a low-voltage-swing bus enables the use of smaller bus drivers in bus driver blocks 672 and 674, which may reduce load and pulse-clock power consumption. Further, in a low-voltage-swing system, PMOSFET-device pulse-passgate-logic or "steering" logic may be used to perform MUX, AND/OR and XOR operations before returning to full-voltage-swing logic, as is shown, for example, in blocks 610 and 652. To limit or reduce noise in these systems, of course, it is believed that the low-voltage-swing signals should be shielded from the full-voltage-swing signals. In this regard, the MOSFET devices should be matched appropriately and suitable circuit techniques should be used to better ensure relatively strong differential signals.

As discussed, it is believed that using the present low-voltage-swing and pulse-passgate-logic topologies may provide the following advantages. First, it is believed that such topologies may benefit from low (or "zero") threshold-voltage PMOSFET-devices since there should be little or no increased current leakage. Second, smaller low-voltage-swing drivers may be used, and this may reduce the "di/dt" voltages on the power supply rails by up to something on the order of about a factor of three depending on the particular application. Third, "soft error" rates for low-voltage-swing logic nodes may not increase when the nodes are pre-discharged to relative ground (true ground or Vss). Fourth, low-voltage-swing signals may reduce the percentage of the cycle needed to compensate for any "RC" delay in a data path of the logic arrangement. This should improve scalability of the MOSFET-devices, since it is not believed that RC delays scale well. Fifth, these logic arrangements should reduce clock loading by a factor of something on the order of about two (2) to five (5) for at least some logic arrangements depending on the particular application, and this may reduce clock skew, RC delay or power consumption. Finally, using differential MOSFET-device sense-amplifier buffer arrangements, such as PMOSFET-device sense-amplifier arrangements 620 and 660, with dual-rail or differential domino-logic arrangements may also reduce or at least limit any delay problems, and allow the use of higher pulse clock rates. Thus, low-voltage-swing and pulse-passgate-logic circuit topologies may be used to provide higher frequency, lower power or smaller area circuits depending on the particular integrated circuit application.

Also, by using the low-voltage-swing and pulse-passgate-logic topologies and methods of the present system, this should reduce power consumption in an integrated circuit having full-voltage-swing arrangements. To accomplish this, the pulse-clocked and ratioed PMOSFET-device sense-amplifier buffer arrangements 620 and 660, which are further discussed below, may be used to amplify and buffer the low-voltage-swing signals so as to restore these signals to full-voltage-swing signals.

Figure 3:
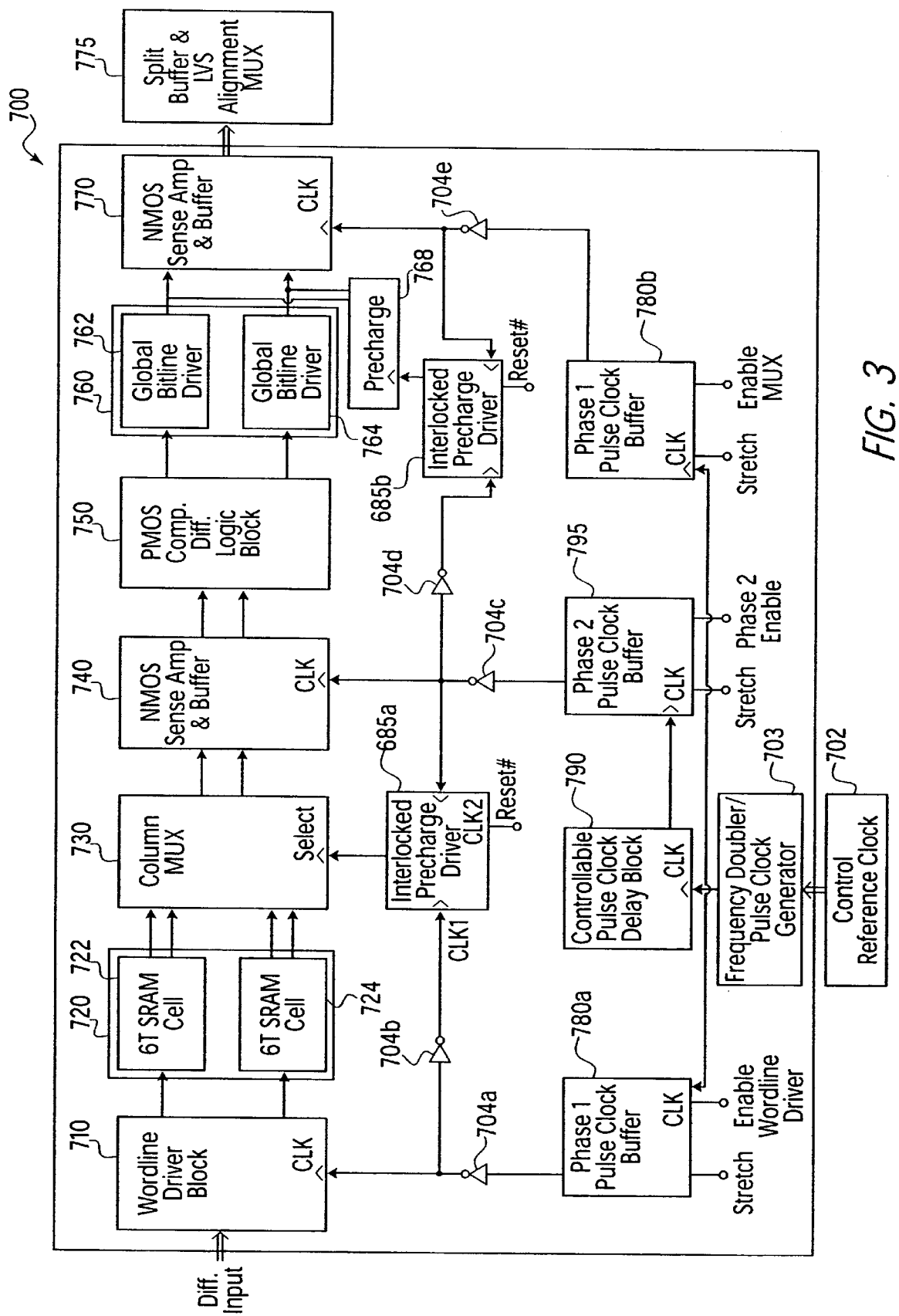
FIG. 3 shows another low-voltage-swing and pulse-passgate-logic schematic and topology for a component of a cache arrangement, which may be used with a microprocessor system and which includes the controllable pulse-clock-delay arrangement of FIG. 5 and FIG. 6.

Exemplary low-voltage-swing and pulse-passgate-logic topologies include the low-voltage-swing and pulse-passgate-logic carry-skip adder component 600 of an arithmetric logic unit of FIG. 1, and the low-voltage-swing and pulse-passgate-logic cache component 700 of FIG. 3.

Figure 2A:
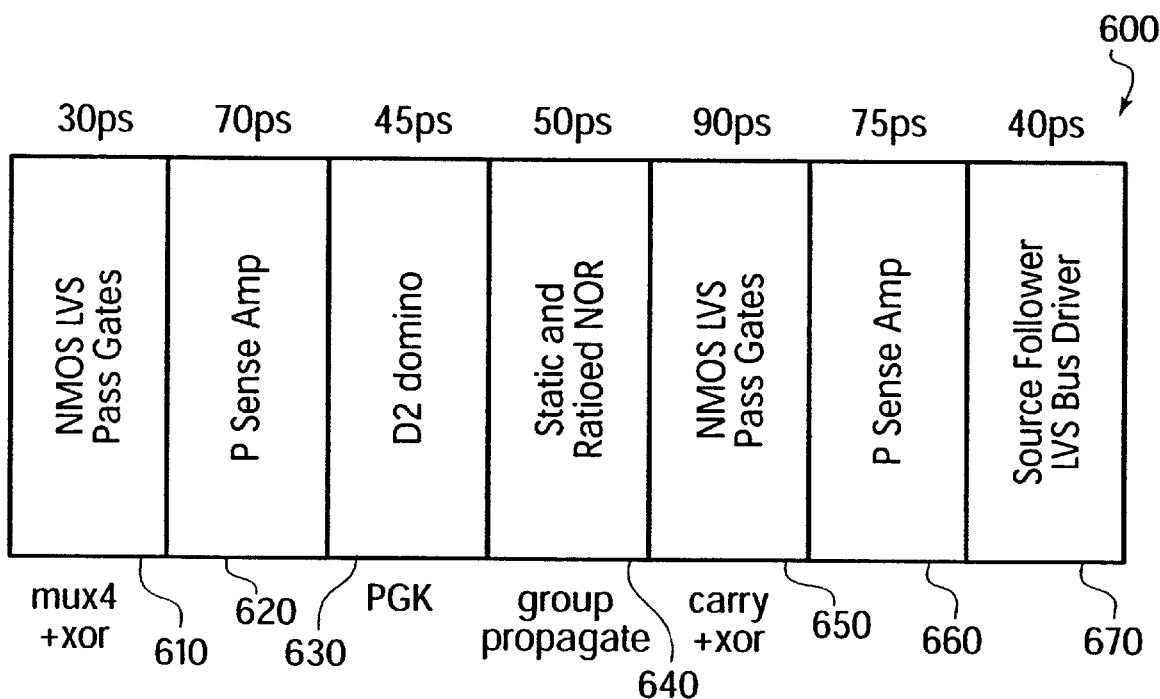
FIG. 2A shows a simplified block layout of the low-voltage-swing pulse-passgate-logic topology for the carry-skip adder component of an arithmetic logic unit arrangement of FIG. 1.
Figure 2B:
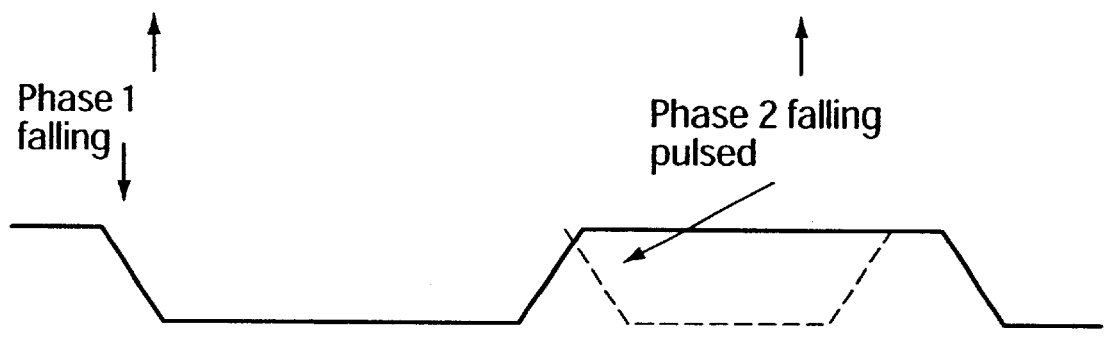
FIG. 2B shows a corresponding pulse clock diagram for the low-voltage-swing and pulse-passgate-logic topology for the carry-skip adder component of an arithmetic logic unit arrangement of FIG. 1 and FIG. 2A.
Figure 10:
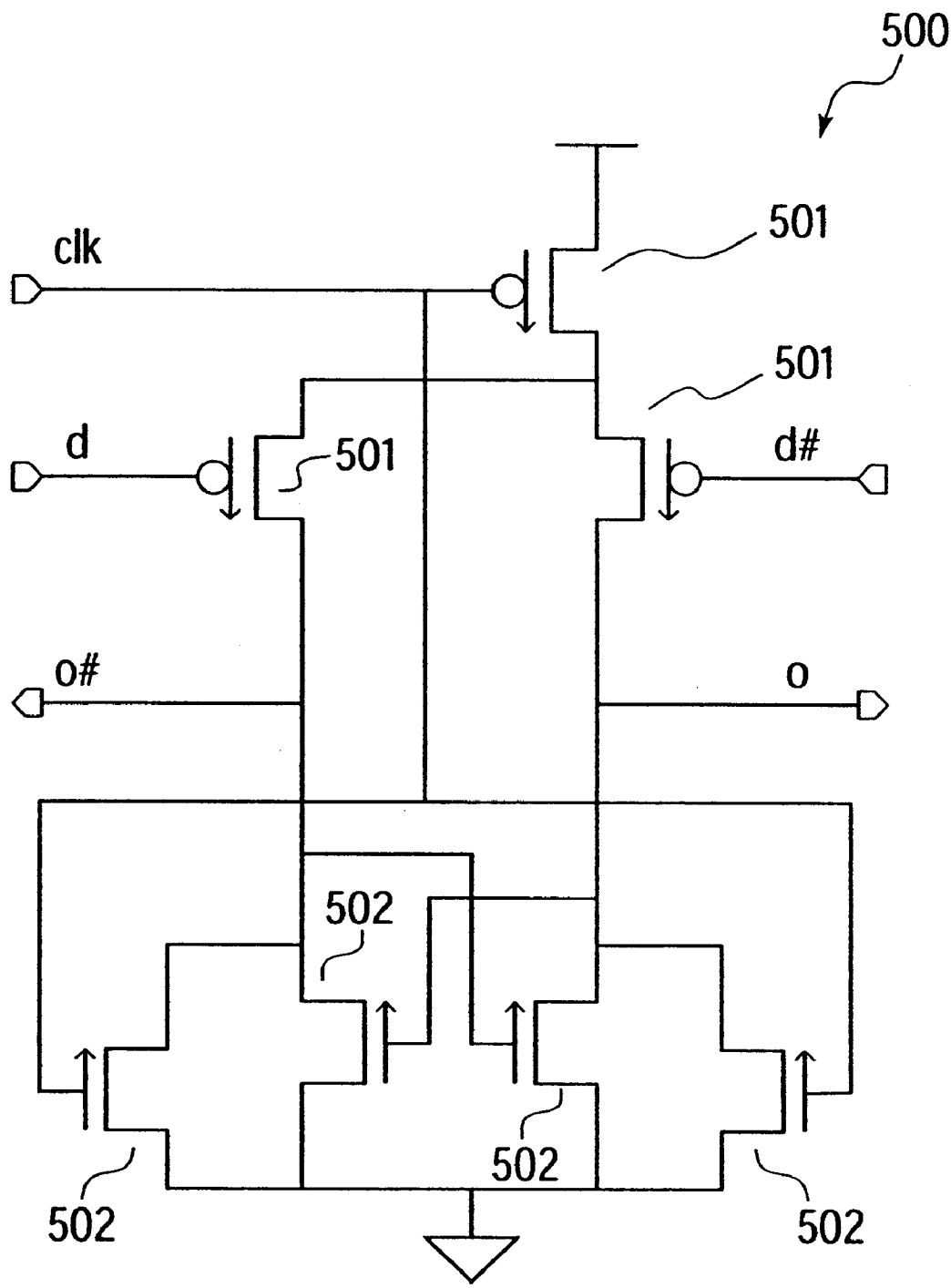
FIG. 10 shows an exemplary embodiment of a ratioed PMOSFET-device sense-amplifier arrangement.

As regards the system of FIG. 1, a simplified topological view of that system 600 is shown in FIG. 2A. In the carry-skip adder design of FIG. 1 and FIG. 2A, only group propagate signals are needed. In this regard, since the evaluation of the PMOSFET-device sense-amplifier arrangement is pulse-clocked, the ratioed NOR logic block 640, may be used to create group propagates for the carry-skip adder 660. As shown, the system includes an NMOSFET-device low-voltage-swing passgate block 610, the PMOSFET-device sense-amplifier blocks 620 and 660, a differential-domino-logic block 630, a static and ratioed NOR block 640 and an NMOSFET-device passgate block (which operates as full-voltage-swing logic) 650, and a source follower and low-voltage-swing bus driver block 670. Depending on the particular application, delays may be on order, for example, of about 30, 70 and 75, 45, 50, 90 and 40 picoseconds, respectively, for each of the blocks. The accompanying waveform of FIG. 2B illustrates the $\phi 1$ and $\phi 2$ pulse clock boundaries It is believed that by using pulse clocks in low-voltage-swing topologies, ratioed logic families, such as the ratioed PMOSFET-device sense-amplifier arrangement of FIG. 10, which should provide faster operating speeds and shorter gate delays, may be used more readily. This is because the use of pulse clocks should reduce the amount of time that such MOSFET-device arrangements may be contending. In particular, the exemplary ratioed PMOSFET-device sense-amplifier buffer arrangement of FIG. 10 has PMOSFET-device differential pairs and is used to sense the low-voltage-swing signals that are pre-discharged to relative ground (true ground or Vss). The PMOSFET-device sense-amplifier buffer arrangements 620 and 660 are not stopped in the evaluated state because ratioed logic is used to hold one output low while the other output is pulled high. In FIG. 10, the ratioed PMOSFET-device sense-amplifier arrangement includes four NMOSFET-devices 502 and three PMOSFET-devices 501 that are arranged and coupled as shown.

Figure 5:
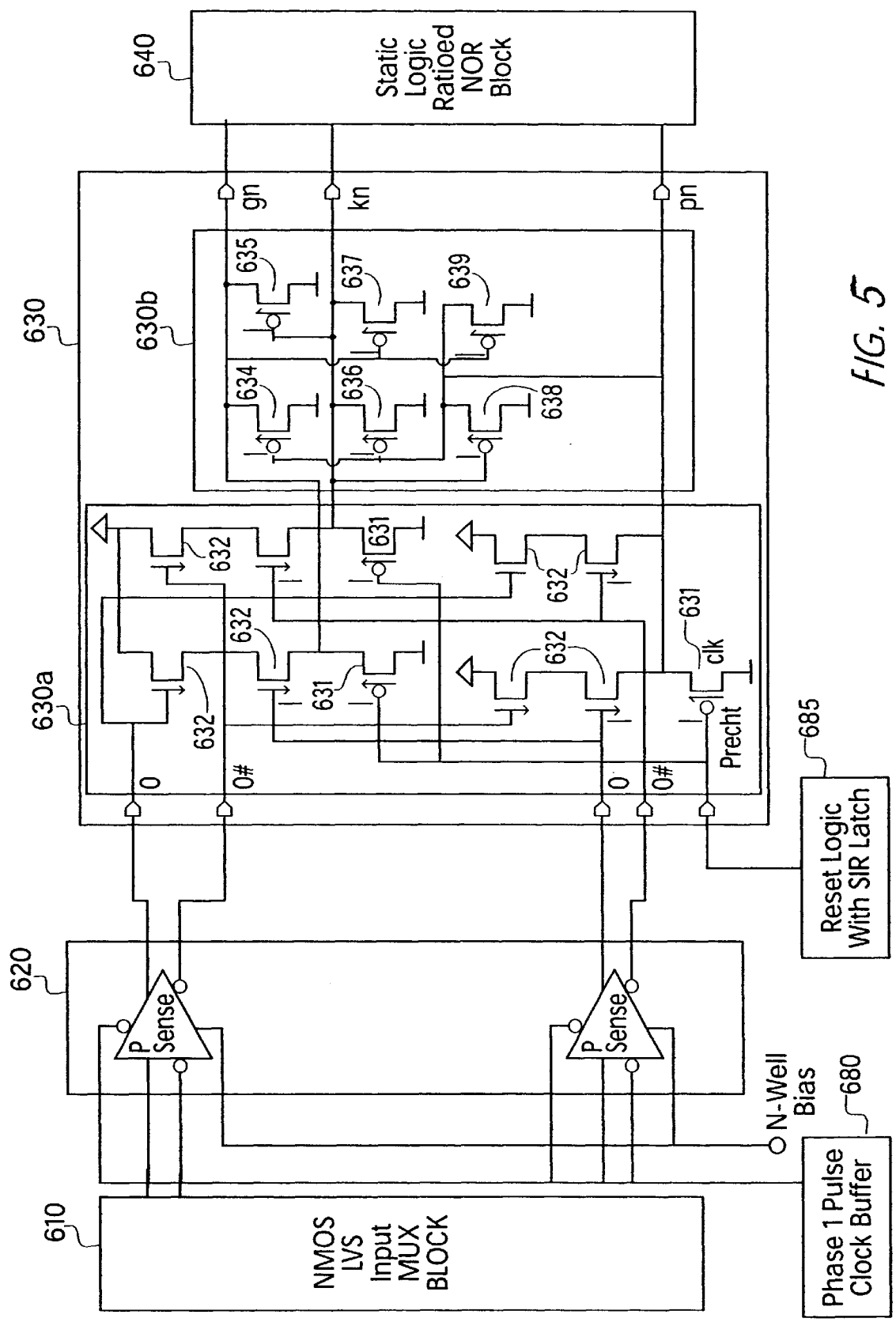
FIG. 5 shows a cross-coupled PMOSFET-device arrangement for a differential domino logic arrangement, that receives valid input data signals from a sense amplifier arrangement and that has a plurality of mutually exclusive outputs.

As shown in FIG. 5, for example, the differential-domino-logic-block 630 uses a cross-coupled PMOSFET-device buffer arrangement 630b. The cross-coupled PMOSFET-device buffer arrangement 630b should help reject noise, and also help to buffer the load of the bus drivers. A dual cross-coupled PMOSFET-device buffer arrangement (not shown) is also used in the complementary domino logic and bus driver block 670.

As regards the differential-domino-logic blocks 630 and 670, for example, since the dual domino inputs are driven from the PMOSFET-device sense-amplifier arrangement 620 and 660, respectively, the loading between the true and the complement signals should be better matched. In this regard, in FIG. 5, the PMOSFET-device 634 to 639 are cross-coupled so that they may be of relatively larger sizes to better reject any voltage "noise bumps". These voltage "noise bumps" may result from the PMOSFET-device sense-amplifier arrangements 622 and 624 resolving relatively small differential voltages, which may, for example, be on the order of about one hundred (100) millivolts. Thus, the cross-coupled PMOSFET-device buffer arrangement 630b is coupled, for example, to the differential domino-logic arrangement 630a, which has outputs that are mutually exclusive in one logic state, such as the low logic state, so that when one output is in one logic state, such as the low logic state, the other outputs are in a different logic state, such as a high logic state. Thus, for example, when all the outputs are pre-charged, and one nodal output is evaluated to its low logic state, for example, this drives the other cross-coupled PMOSFET-devices so as to hold the other outputs in their high logic state. The exemplary complementary/differential domino logic arrangement 630a includes three PMOSFET-devices 631 and eight NMOSFET-devices 632 that are arranged and coupled as shown in FIG. 5.

Also, it is believed that the cross-coupled PMOSFET-device buffer arrangement operates as a gain stage to improve the gain of the output loading of the differential domino logic arrangement (to which the cross-coupled PMOSFET-device buffer arrangement is coupled) with respect to the input loading of the next logic arrangement or stage, which receives as inputs the mutually exclusive outputs of the differential domino logic arrangement.

It is also believed that such cross-coupled PMOSFET-device buffer arrangements may be useful in limiting delay margins or noise margins. In particular, it is believed that such cross-coupled PMOSFET-device buffer arrangements may be scaled up in size without increasing, at least unacceptably, any delay that may be associated with such ratioed PMOSFET-device sense-amplifier arrangements. It is also believed that this ability to scale up such PMOSFET-device buffer arrangements should make the corresponding inputs of the logic arrangements to which they are coupled, such as to differential domino-logic arrangements, less susceptible to any voltage "noise bumps" on the low output side of the differential outputs of the sense-amplifier buffer arrangements. Thus, the ability to use larger scale ratioed PMOSFET-device sense-amplifier buffer arrangements should better ensure a more robust circuit that is less susceptible to such voltage "noise bumps". Also, since a logic inverter is not needed to provide signal feedback to a PMOSFET-device, as may be the case in certain "keeper" circuits, the output load may be reduced, the circuit speed may be increased or the corresponding circuit area may be smaller. Finally, in the present system, it is only required that each of the outputs of the logic arrangement be mutually exclusive in one of their logic states, such as their low logic state, as discussed above.

As further regards the exemplary PMOSFET-device sense-amplifier buffer arrangement 500 of FIG. 10, it has three operating zones. In a delay insensitive zone, any delay in the PMOSFET-device sense-amplifier buffer arrangement 500 depends on the pulse clock. In a "push-out" zone, any delay depends on the pulse clock and also on the input differential. Finally, in a failure zone, any delay may be increased to unacceptable levels or the PMOSFET-device sense-amplifier buffer arrangement may evaluate in the "wrong direction" or enter a metastable state.

For robust operation, the PMOSFET-device sense-amplifier buffer arrangement 500 should be clocked in its delay insensitive zone. Also, a controlled voltage offset should be provided to cover the random offset and other noise sources, such as leakage and coupling, by a certain margin. Moreover, any coupling noise should be controlled using suitably appropriate shielding and matching techniques. Since leakage noise may only affect the circuit within a small time window (after the removal of the reset clock and before evaluation clocking of the sense-amplifier arrangement), leakage issues may not be as severe as in non-LVS circuits where the sensitive window is normally one phase of the clock or even longer when the clock is stopped. After grouping all of the random offset and noise sources together, an appropriate controlled voltage offset may be applied such that the sense-amplifier arrangement operates in the delay insensitive zone.

While the PMOSFET-device sense-amplifier buffer arrangement 500 is an edge-triggered device in terms of sensitivity to clock "uncertainty", such a sense-amplifier buffer arrangement in a low-voltage-swing system may behave differently depending upon it its operating zone. At the boundary of its push-out and failure zones, it may behave something like a flip-flop. In the delay insensitive zone, where it may be designed to operate, it may behave something like a domino-logic system with a limited time borrowing window. Time borrowing may also exist in the push-out zone, where the forward delay or latency may vary with the clock edge position, the rate of differential signal development and the push-out sensitivity of the sense-amplifier arrangement. Since time borrowing in a low-voltage-swing system may exist, this may reduce any performance penalty due to clock uncertainty. In cascaded low-voltage-swing "pipe" stages, some clock skew or jitter penalty is taken once instead of in each cascaded or "pipe" stage. If the data path loops back on itself, then clock jitter sensitivity may be reduced.

As further regards the low-voltage-swing and pulse-passgate-logic carry-skip adder component of FIG. 1 and FIG. 2A, its topology is as follows.

The carry-skip adder component 600 comprises a frequency doubler and pulse clock generator block 603, which receives appropriate control signals and a reference clock from a control and reference clock block 602, a bus equalizer and pulse clock buffer block 675 having stretch and "uopvalid" control inputs, a $\phi 1$ pulse clock buffer block 680 having an "addervalid" control input, a reset logic with set/reset latch block 685 having a reset control input, a controllable pulse clock delay block 690 having stretch, delay 1 and delay 2 control inputs, and a $\phi 2$ pulse clock buffer block 695 having a stretch control input, as well as logic inverter elements 604a and 604b.

The carry-skip adder component 600 further comprises a bus equalize and pre-discharge block 605, an NMOSFET-device based low-voltage-swing multiplexer block 610, a PMOSFET-device sense-amplifier block 620, which includes dual PMOSFET-device sense-amplifier arrangements 622 and 624, a complementary domino-logic block 630, a static logic and ratioed NOR block 640, a low-voltage-swing propagate-generate-kill and XOR block 650, which includes a low-voltage-swing propagate-generate-kill block 651 and dual low-voltage-swing XOR blocks 654 and 656 in low-voltage-swing XOR block 652, another PMOSFET-device sense-amplifier block 660, which includes dual PMOSFET-device sense-amplifier arrangements 662 and 664, and dual complementary domino-logic and bus driver blocks 672 and 674 in a complementary domino-logic and bus driver block 670, which is coupled to an output bus 601 and by dual writeback lines to the bus equalize and pre-discharge block 605.

Each of the blocks is coupled as shown and as discussed with respect to FIG. 2A, and receive the signals corresponding to either the $\phi 1$ or $\phi 2$ pulse clock signals as shown. As to the blocks 630 and 640 they receive a pulse clock signal corresponding to the $\phi 1$ pulse clock signal from reset logic block 685, which may be configured using an S/R latch, while the complementary domino-logic block 674 receives a pulse clock signal corresponding to the $\phi 2$ pulse clock signal. Of course, the embodiment is exemplary and may be configured differently depending, for example, on the particular application. In another configuration, for example, the reset logic block 685 may not be used.

As to the bus equalize and pre-discharge block 605, after the bus 601 is sampled by the receiving logic arrangement, the bus 601 is equalized and pre-discharged at the beginning of a pulse clock cycle. In the 4-to-1 low-voltage-swing multiplexer block 610, the select lines control which of four inputs is selected and also whether the input should be inverted. An equalize signal is used during a reset condition so that the inputs to the dual PMOSFET-device sense-amplifier block 620 are at about the same voltage. Since the bus 601 is pre-discharged to relative ground (Vss) and the select lines are full-swing lines, the resistance of the differential NMOSFET-device passgates of the NMOSFET-device low-voltage-swing input multiplexer block 610 should be relatively low so that relatively smaller MOSFET devices may be used to reduce the load on the control select lines.

As further regards the low-voltage-swing and pulse-passgate-logic topology of FIG. 1, it is noted that the layout area and shielding requirements may be limited or reduced due to reduced routing of local signals. In particular, since only two differential pairs are routed for the width of the carry-skip adder 600, appropriate shielding and a symmetrical layout may be used to better ensure that any alternating-current, which may result from the coupling of the full-voltage-swing signals and the low-voltage-swing differential pair signals, is matched to within acceptable tolerances. This should help eliminate any systematic voltage offset that may appear in the PMOSFET-device sense-amplifier buffer arrangements 620 and 660.

Layout templates may, of course, be used for each topology to reduce clock inaccuracy by matching the width of the pulse clock to the delay of a logic arrangement. Any layout for a low-voltage-swing bus may, however, be problematic because the signals below or above the bus may couple unequally into one side of a differential pair and create a systematic voltage offset. In this regard, one layer of metal may be used to shield the wires from below, but this may be relatively expensive. Accordingly, layout checks may need to be made to better ensure that the signals run perpendicular to the low-voltage-swing bus so that any coupling is limited and matched. The reset path of the domino-logic arrangements and the self-timed sense-amplifier buffer arrangement clock paths should also be matched to their corresponding data paths in the logic arrangement.

The exemplary differential domino-logic arrangement shown in FIG. 5 receives the output of the dual PMOSFET-device sense-amplifier buffer arrangement 620 as input, and provides the propagate, generate and kill signals for the carry-skip adder 600. In particular, the domino-logic block 630$a$ is arranged so that the pn, gn and kn outputs are mutually exclusive in their low state. In this regard, it uses cross-coupled PMOSFET devices 634 to 639 to hold the outputs, which do not switch to their low logic state, in their high logic state. As discussed, it is believed that this allows the cross-coupled PMOSFET devices 634 to 639 to be larger than they might otherwise be if certain "domino" arrangements were used instead. Also, as discussed, this should provide additional voltage "noise bump" immunity, which is needed for the outputs of the dual PMOSFET-device sense-amplifier buffer arrangements 620. This is because there may be a voltage "noise bump" that the logic arrangement inputs might receive that could, for example, falsely trigger a domino state. Also, it is believed that this approach may not have the scaling concern of increasing noise sensitivity that other logic arrangements may have. Since the present arrangement only drives the static logic and ratioed NOR block 640, it is believed that by using ratioed logic, relatively wide ANDing or NORing operations may be used to accomplish certain operations, including group propagates, more efficiently. In the ratioed logic of block 640, the contention state occurs only for the width of a pulse (and not the actual period of the pulse clock).

The pulse-passgate-logic MOSFET devices of block 651 are used to "steer" the low-voltage-swing signals to the dual PMOSFET-device sense-amplifier arrangements 660, and to perform the carry (or propagate) and XOR functions in block 652 of the carry-skip adder 600. The propagate-generate-kill logic arrangement operates as known propagate-generate-kill circuits do. In particular, a propagate signal "carries" a high logic value only if the input signals are the same, a generate signal carries a high logic value unless both input signals are high logic values, and a kill signal carries a high logic value if at least one input signal is a high logic value. The propagate-generate-kill logic arrangement of FIG. 1 uses a low-voltage-swing circuit architecture, and includes three cells of a low-voltage-swing ripple carry circuit, which are coupled to the low-voltage-swing XOR logic block 652, which performs the final summing operation. An equalization MOSFET device may also be used to better ensure that the inputs to the PMOSFET-device sense-amplifier buffer arrangement 660 are at the same voltage during its reset condition.

An advantage of the carry-skip adder 600 is that only group propagates are needed, and not group generates or kills. This should reduce the number of MOSFET devices required to implement arithmetic functions. The positions for each of the group propagates should be chosen to reduce the maximum number of series MOSFET devices required sum the outputs. Accordingly, the area for a carry-skip adder may be on the order of about two to three times smaller than at least certain other adder circuits because of reductions in the number of devices or "wired" paths. As further regards the carry-skip adder structure, the nodes are discharged to relative ground (true ground or Vss) and pulled up to their high logic state by PMOSFET devices. Additionally, there are multiple (for example, eight) levels of the passgate devices, which should provide faster operation since a pulse clock system is used.

In the pulse-passgate-logic and low-voltage-swing carry-skip adder 600, the MOSFET devices are "channel connected" because the sources and drains are connected together. This effectively provides a "one gate" (or reduced "gate") carry-skip adder, which is unlike CMOSFET adders having a number of "gates". This "one gate" pulse-passgate-logic low-voltage-swing adder should be practical because the system does not need to fully swing to the supply voltage (Vcc or Vdd) as in full-voltage-swing CMOSFET adder arrangements. A static CMOSFET adder, for example, may have four input NAND gates in series. With the present pulse-passgate-logic low-voltage-swing carry-skip adder arrangement, there may be, for example, eight (8) NMOSFET devices providing thirty-two (32) outputs on one gate. This should provide improved performance on the order of about a factor of two (2) depending on the particular application and the implementation of the integrated circuit.

Finally, low-voltage-swing bus drivers 672 and 674, which have both source follower pull-up and pull-down NMOSFET devices, which may be used to better avoid line-to-line coupling and help increase any noise margin. These low-voltage-swing bus drivers may be used to drive relatively long wires and may reduce RC delay with respect to the PMOSFET-device sense-amplifier buffer arrangements. Also, by using a low-voltage-swing driver, its circuit size may be kept smaller, and this should help to reduce power supply noise or to reduce any clock jitter or inaccuracy.

As regards the exemplary low-voltage-swing and pulse-passgate-logic cache arrangement 700 of FIG. 3, this cache structure provides one level of multiplexing. Additionally, in this pulse-passgate-logic and low-voltage-swing topology, PMOSFET devices may be used for this structure so that the PMOSFET-device nodes in the PMOSFET-device complementary-differential-logic ("P-CDL") buffer 750 are pre-charged to the supply voltage (Vcc or Vdd). In the cache 700 of FIG. 3, however, NMOSFET devices are used to drive the bit lines. As in the pulse-passgate-logic low-voltage-swing system of FIG. 1A and FIG. 2A, the low-voltage-swing and pulse-passgate-logic cache arrangement 700 uses a frequency doubler 703, $\phi1$ clock buffers 780a and 780b, $\phi2$ clock buffer 795 and a controllable pulse-clock-delay system 790, which is the system 100, discussed below. The cache 700 also includes logic inverters 704a, 704b, 704c, 704d and 704e, which are coupled from the pulse clock blocks to certain of the logic blocks as shown.

Figure 12:
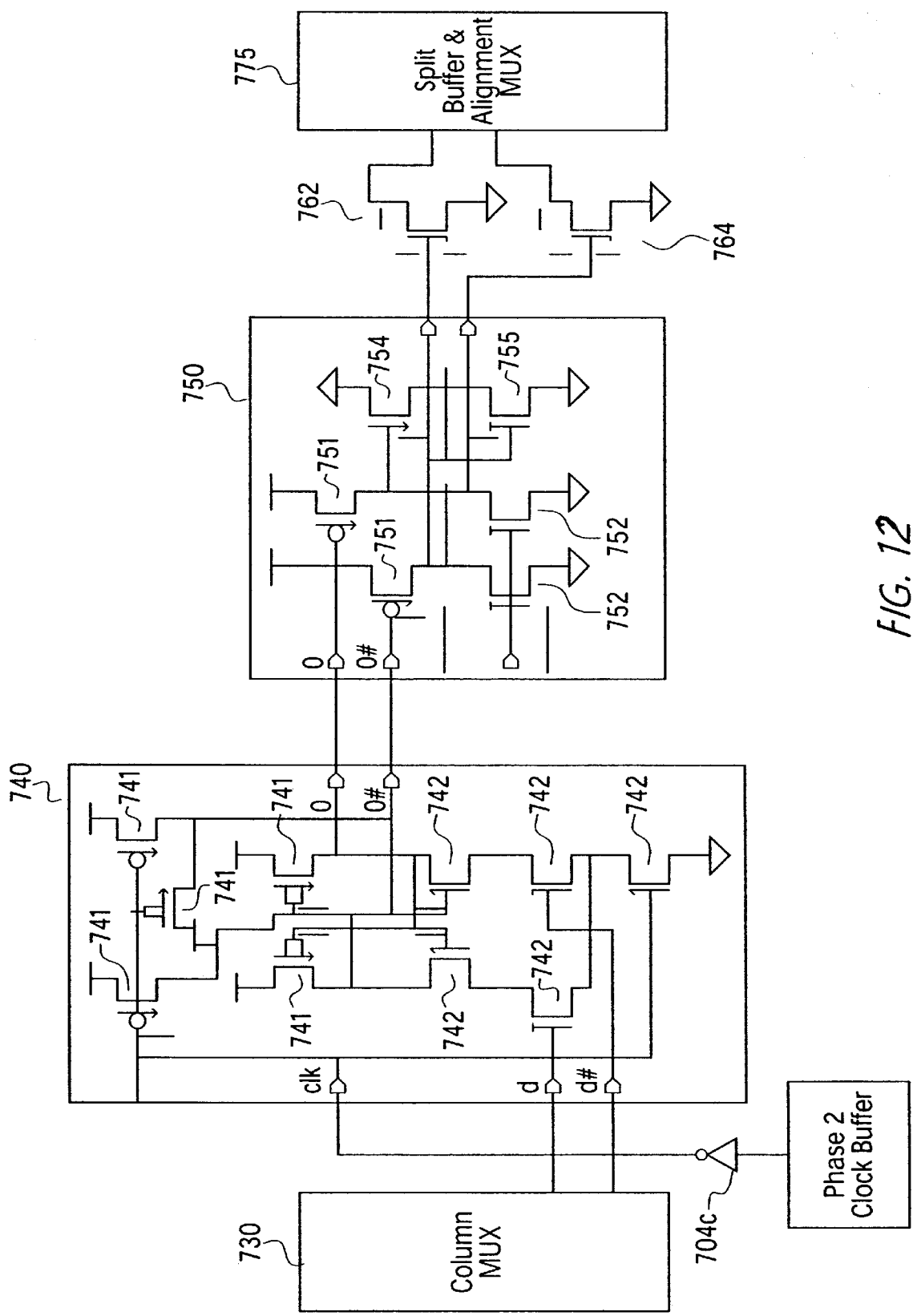
FIG. 12 shows an exemplary NMOSFET-device sense-amplifier arrangement, and a dual cross-coupled NMOSFET-device buffer arrangement coupled to a complementary domino-logic arrangement.

The cache topology 700 also includes a full-voltage-swing wordline driver block 710 and a static decoder block 720 (including two (2) 6T-SRAM cells 722 and 724), a low-voltage-swing column multiplexer 730, a differential NMOSFET-device sense-amplifier buffer arrangement 740 (which may also be a single-ended NMOSFET-device sense-amplifier buffer arrangement depending on the particular design or application), a PMOSFET-device complementary-differential-logic buffer 750, a pair of global bit-line drivers 762 and 764 of bitline driver block 760, a pre-charge block 768 and another differential NMOSFET-device sense-amplifier buffer arrangement 770 (which may also be a single-ended NMOSFET-device sense-amplifier buffer arrangement depending on the particular design or application). The differential NMOSFET-device sense-amplifier buffer arrangement 770 may be coupled to a "split" buffer and a low-voltage-swing pulse-passgate-logic alignment multiplexer 775, which may comprise pulse-passgate-logic MOSFET devices. An exemplary embodiment of the NMOSFET-device sense-amplifier buffer arrangement 740 (and sense-amplifier buffer arrangement 770) is shown in FIG. 12.

Additionally, two interlocked pre-charge drivers 685 and 685b are used to provide both the fast $\phi1$ input pulse clock and the fast $\phi2$ output pulse clock to the low-voltage-swing column multiplexer 730 and to the pre-charge block 768. The pre-charge block 768 is coupled to the true and to the complementary outputs of the global bit-line driver pair, which may be used to drive the signals relatively "long" distances (for example, or the order of about 2000 $\mu$m). In the low-voltage-swing PMOSFET-device column multiplexer 730, a bit-line from the SRAM block 720 is selected when the interlocked pre-charge driver 685a outputs the fast $\phi1$ input pulse clock, and the selection feature is turned off when the interlocked pre-charge driver 685a outputs the fast $\phi2$ output pulse clock. The second interlocked pre-charge driver block 685b is used to properly pre-charge the outputs of the global bit-line pair and the corresponding inputs of the NMOSFET-device sense-amplifier buffer arrangement 770. Also, the NMOSFET-device sense-amplifier arrangements should not be "turned on" for too long a period since they may draw direct current and consume power, and so a pulse clock is used.

Each of the blocks in FIG. 3 is coupled as shown, and certain of the blocks receive pulse clock signals corresponding to either the $\phi1$ or $\phi2$ pulse clock signals as shown.

Figure 11:
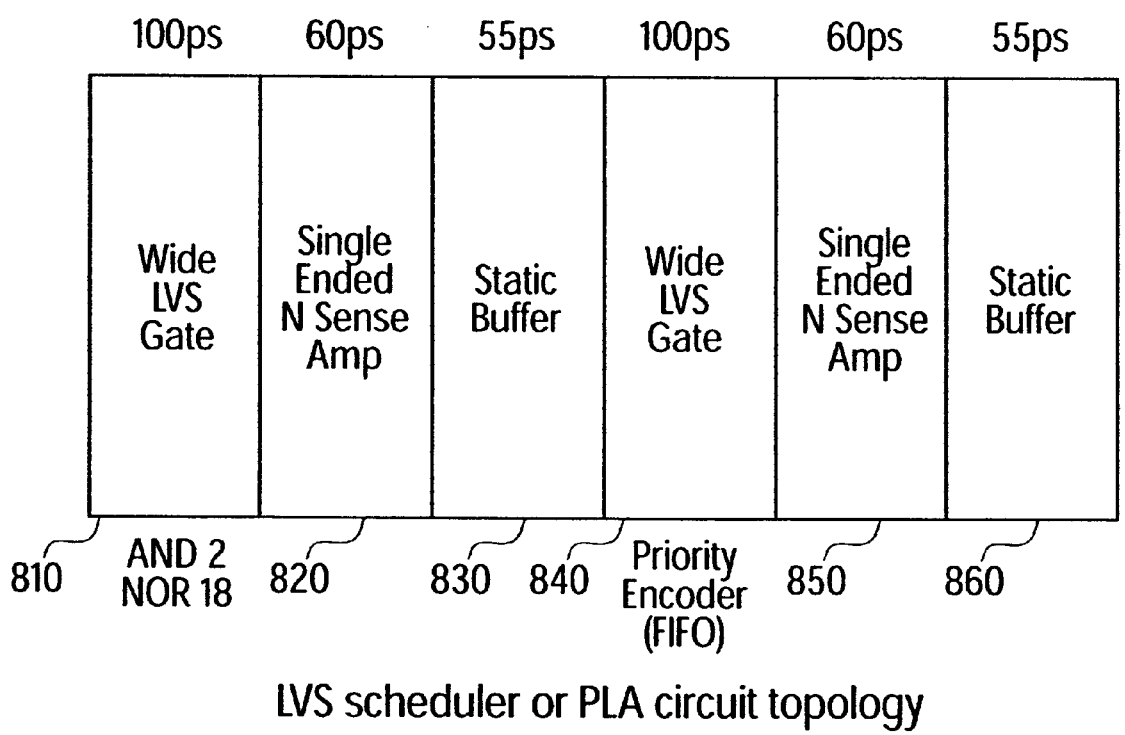
FIG. 11 shows an LVS scheduler or PLA circuit topology.

Another exemplary topology is the low-voltage-swing scheduler 800 of FIG. 11. This topology may use single-ended NMOSFET-device sense-amplifier arrangements. In particular, this low-voltage-swing circuit topology may also be used for certain programmable logic array ("PLA") structures. As shown, this circuit topology includes a wide low-voltage-swing gate block 810, a single-ended NMOSFET-device sense-amplifier block 820, a static buffer block 830, another wide low-voltage-swing gate block 840, another single-ended NMOSFET sense amplifier block 850, and another static buffer block 840. In particular, the static buffers are used after each of the single-ended NMOSFET-device sense-amplifiers blocks 820 and 850 to increase the gain of the system 800 and to limit or reduce the voltage "bump" noise, which may occur when the sense-amplifiers 820 and 850 are set. Otherwise, it is believed that cascading the PLA-type low-voltage-swing blocks may cause certain problems, including noise problems.

A single-ended NMOSFET-device sense-amplifier arrangement may be used to sense single-ended low-voltage-swing signals that have been pre-charged to Vcc (Vdd). In particular, it may be used when wide single-ended low-voltage-swing NOR functions are sampled. Examples of a logic block that may use such an arrangement include the low-voltage-swing scheduler and a PLA circuit topologies discussed above. It is believed that by skewing the input NMOSFET pair, a controlled offset voltage may be introduced. The NMOSFET-device sense-amplifier arrangement is pulse clocked when the worst case differential signal exceeds the controlled offset voltage by an appropriate predetermined margin. Two PMOSFET devices are used to equalize the output modes and the drain nodes of the input NMOSFET pair. Also, a "dummy" NMOSFET capacitor may be used to skew the sensing pair.

Also, in FIG. 12 is shown an exemplary NMOSFET-device sense-amplifier arrangement 740 (and a dual cross-coupled NMOSFET-device buffer arrangement) coupled to a complementary domino-logic arrangement 750. It is noted that arrangement 770 is not shown in FIG. 12, but it is shown in FIG. 3. The global bitline drivers 762 and 764 each include an NMOSFET-device, respectively. The exemplary NMOSFET-device sense-amplifier arrangement 740 includes five PMOSFET-devices 741 and five NMOSFET-devices 742 arranged and coupled as shown. The complementary domino-logic arrangement 750 includes two PMOSFET-devices 751, two NMOSFET-devices 752 and NMOSFET-devices 754 and 755 that are arranged and coupled as shown.

The topologies discussed above may also be used with "pre-charge low" systems in which the pre-charge potential is a relative ground (true ground or Vss) and the evaluation potential is some supply voltage (Vcc or Vdd). In such an arrangement, the pre-charge transistors are selected to be conductive in their logic low state, such as NMOSFET devices. In such an arrangement, the evaluation transistors may be selected to be conductive in their logic high state, such as PMOSFET devices. Since NMOSFET devices may turn on more quickly and more strongly than PMOSFET devices, if the devices are comparably sized and structured, such MOSFET devices may need to be sized such that at least certain of the PMOSFET and NMOSFET devices in a logic arrangement possess suitably comparable timing characteristics.

In either case, the sense-amplifier buffer arrangements may be differential PMOSFET-type, NMOSFET-type or "single-ended" versions thereof.

It is believed that, where appropriate, the foregoing systems may be used, for example, with various data path logic, including (~30) (16 bits or wider) adders, 3:2 reducers, multiplexes, rotators (shifters), priority encoders, compare logic, parity checkers (~10), logic blocks (such as AND, OR and XOR), sign extension logic, registers, caches, all of which represent a number of the circuits in various high speed processors. Thus, the low-voltage-swing topologies may be used with any other suitably appropriate data path and logic structures to reduce power, circuit area or delay (latency), to increase frequency or, where appropriate, simplify the micro-architecture of such structures.

Figure 6:
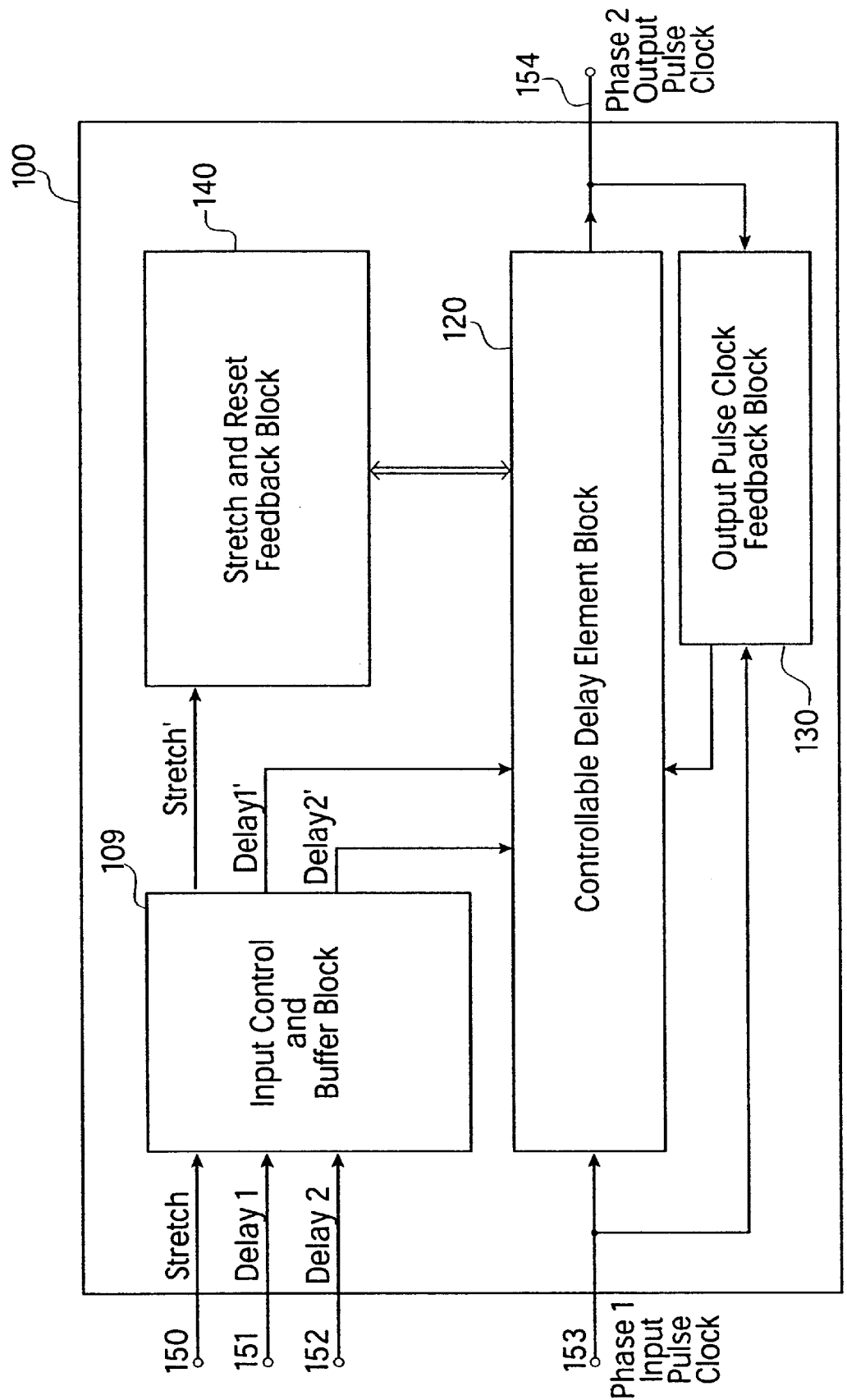
FIG. 6 shows a block schematic diagram of an exemplary embodiment of a MOSFET device-based controllable pulse-clock-delay circuit arrangement for use with at least one functional unit or logic block of an integrated circuit arrangement having a plurality of such functional unit blocks.
Figure 7:
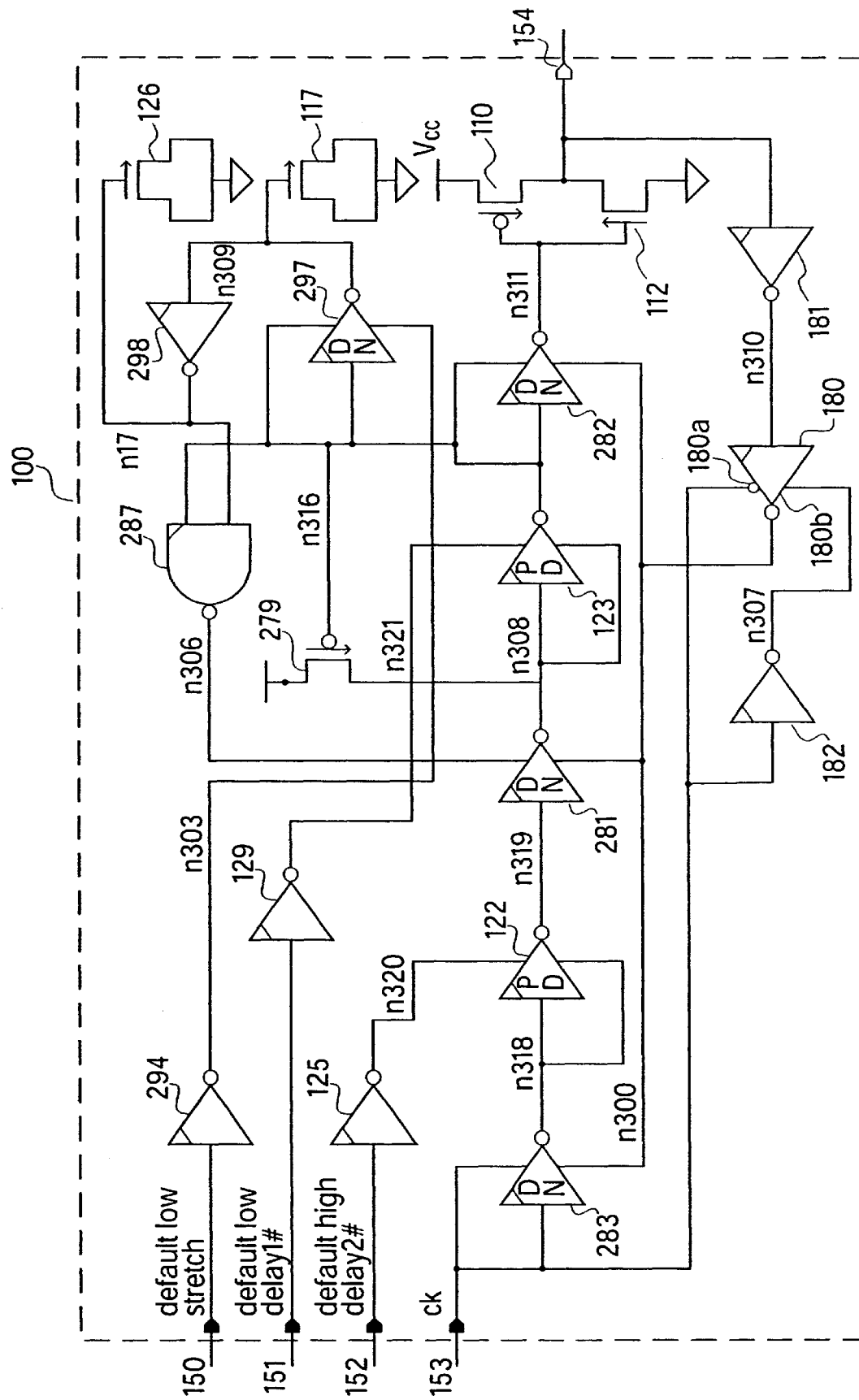
FIG. 7 shows a more detailed schematic diagram of the exemplary embodiment of the MOSFET device-based controllable pulse-clock-delay circuit arrangement of FIG. 6 for use with at least one functional unit block of an integrated circuit arrangement having a plurality of functional unit blocks.

As regards the controllable pulse-clock-delay system discussed with respect to the above systems, an exemplary embodiment of such a controllable pulse-clock-delay system is shown in FIG. 6 and FIG. 7. This controllable pulse-clock-delay system 100 may be used to provide a controllable delay between a relatively fast φ1 input pulse clock (or some other input clock) and a relatively fast φ2 output pulse clock. The external or reference clock for the relatively fast φ1 input pulse clock may be an input clock signal, in which the clock phase may vary with another external or reference clock (or other input clock). Using the controllable pulse-clock-delay system 100, the phase of the fast φ2 output pulse clock may be delayed by a controllable time interval with respect to the phase of the fast φ1 input pulse clock. In this way, the data set-up requirement for some logic arrangement may be adjusted depending on the timing characteristics of the fast φ2 output pulse clock signal.

For example, for the fast φ2 output pulse clock signal arriving at an output data latch arrangement or at a MOSFET-device sense-amplifier arrangement, changing or varying the delay may provide varied fast φ2 output pulse clock signals. This should provide the logic arrangement or the system with less or more race or timing margin depending on the delay of the corresponding data path in the logic arrangement that is being compensated. Otherwise, as discussed, an unwanted race condition may be more likely to occur. As discussed, in such a case, the data signal in a logic arrangement may pass through an output latch arrangement or an output sense-amplifier arrangement before the fast φ2 output pulse clock is able to latch or sense the data signal in the output arrangement. Also, since the race margin is between the fast pulse clock and the data path of each corresponding logic arrangement, each of the functional unit blocks may include local pulse clock circuitry to generate its own fast φ2 output pulse clock using the fast φ1 input pulse clock, which may be received from a local fast φ1 input pulse clock buffer. The fast φ1 input pulse clock may, of course, be regenerated at the fast φ1 input pulse clock buffer in each functional unit block. Thus, the fast φ1 and φ2 pulse clocks may be generated locally at each of the functional unit blocks requiring a local pulse clock arrangement.

As discussed, the pulse clock is a single-cycle or "pseudo" two-phase dynamic design. This is because the next phase of the fast φ2 output pulse clock is clocked off of the rising pulse clock edge (or a falling clock edge) of the fast φ1 input pulse clock, and the second evaluation phase is self-timed from this same pulse clock edge. Thus, the fast φ2 output pulse clock is "self-timed" relative to the fast φ1 input pulse clock. The φ2 output pulse clock may be used to drive PMOSFET-device sense-amplifier arrangements, which sample the differential outputs of the preceding logic arrangement, such as a pulsed-passgate-logic domino-logic. Since the φ2 output pulse clock is self-timed relative to the data signal in the data path of the corresponding logic arrangement, there is a margin for variations in delay between the data signal in the data path and the φ2 output pulse clock. There should also be an appropriate margin for any built-in offset voltage in such PMOSFET-device sense amplifier arrangements.

Figure 9:
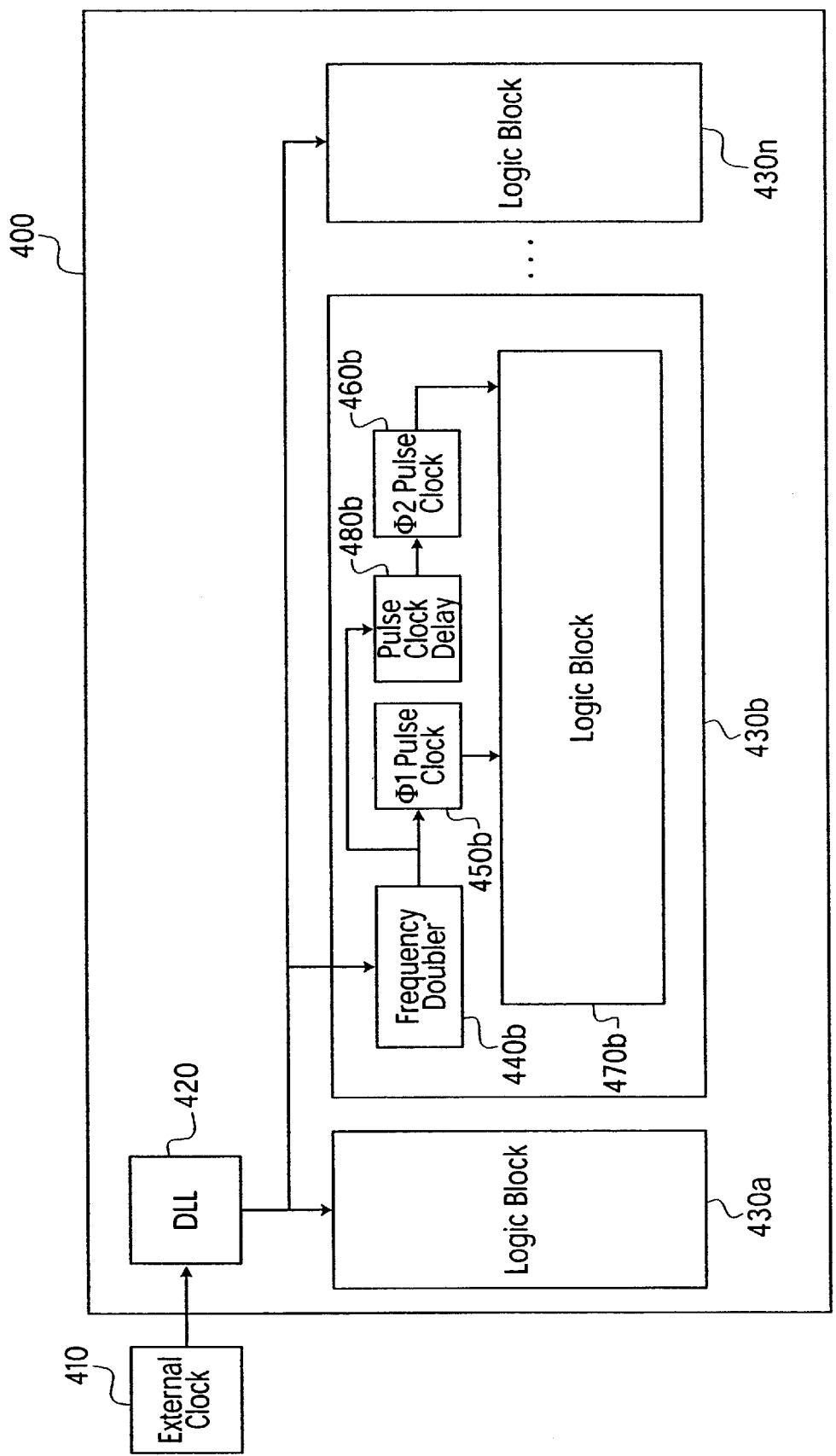
FIG. 9 shows an integrated circuit arrangement, which may be a microprocessor or any other suitably appropriate logic arrangement, that uses the MOSFET-device controllable pulse-clock-delay circuit arrangement of FIG. 6 and FIG. 7.

As shown in FIG. 9, the φ1 input pulse clock and the φ2 output pulse clock are generated or regenerated in local clock buffers 450b and 460b, and in controllable pulse clock delay block 480b, which corresponds to the controllable pulse clock delay system 100 of FIG. 6 and FIG. 7, at each appropriate functional unit block. Local pulse clocks are used to provide better phase tracking of the pulse clock to the clocked data path. In particular, the controllable pulse clock delay block 480, which corresponds to the controllable pulse clock delay system 100 of FIG. 6 and FIG. 7, is used to generate the φ2 output pulse clock. In this system, controllable pulse clock delay devices, which may be "stretched" (or shortened) based on the φ1 input pulse clock, are effectively added to the φ1 input pulse clock so as to provide the phase delayed φ2 output pulse clock. A φ2 output pulse clock feedback arrangement is used to "sample" the self-timed delay relative to the cycle time of the φ1 input pulse clock to control the amount of phase delay or phase shift between the φ1 input pulse clock and the φ2 output pulse clock. As discussed, this converts the self-timed race margin into a "speed path" so that lesser sigma margins (which may be in the order of two (2) sigma margins) may be used, rather than the larger sigma margins (which may be on the order of about five (5) sigma margins) that may be otherwise required. It is believed that this approach may, for example, provide a margin or time savings that is something on the order of about 50 picoseconds per sense-amplifier arrangement (or on the order of about 10% of the standard reference clock cycle per sense-amplifier arrangement) depending on the particular system application and configuration. Thus, for two sense-amplifier arrangements, this approach may, for example, provide a margin or time savings that is something on the order of about 100 picoseconds (or on the order of about 20% of the standard reference clock cycle).

As discussed, the exemplary embodiment of the present system 100 is shown in FIG. 6. In particular, FIG. 6 shows a block schematic diagram of the controllable pulse-clock-delay system 100. As shown, the controllable pulse-clockdelay system 100 comprises an optional control line and input buffer block 109, a controllable pulse-clock-delay device block 120, a fast φ2 output pulse clock feedback block 130 and a clock stretch and reset feedback block 140. The control line and input buffer block 109 of the controllable pulse-clock-delay system 100 includes three control lines, which may be used to control digitally the width of a pulse and which may be used to test a particular circuit configuration. The three control lines include a stretch control line 150, a first delay control line (delay 1#) 151 and a second delay control line (delay 2#) 152. The stretch and delay control lines 150, 151 and 152 are coupled through the control line and input buffer block 109 to the controllable pulse-clock-delay device block 120 and to the clock stretch and reset feedback block 140. In particular, the fast φ2 output pulse clock feedback block 130 is used to control the phase or timing of the fast φ2 output pulse clock. Additionally, the optional clock stretch and reset feedback block 140 may be used to determine a pulse width or a phase delay of the fast φ2 output pulse clock.

The block schematic of FIG. 9, as well as the integrated circuit topologies of FIG. 1 and FIG. 3, shows a generalized local pulse clock and functional unit block topology of integrated circuit 400. As is shown, the integrated circuit 400 may have a slower external clock 410 that provides a base clock signal to a reference clock arrangement or system 420 for varying the clock frequency, such as a phase-locked loop arrangement or a differential delay line arrangement. As discussed above, such arrangements may be used, for example, to multiply the base clock frequency so as to provide a reference clock signal that has a higher clock frequency. As is also shown, the topology of the integrated circuit 400 may include a local frequency doubler 440a, 440b, ..., 440n, which may be a variable width pulse clock generator, the fast φ1 input pulse clock generator 450a, 450a, ..., 450n, the fast φ2 input pulse clock generator 460a, 460b, ..., 460n, and the controllable pulse-clock-delay block 480a, 480b, ..., 480n, which corresponds to the controllable pulse-clock-delay system 100 of FIG. 6 and FIG. 7, and which is used to provide the fast φ2 output pulse clock (based on the fast φ1 input pulse clock). In this way, the fast φ1 and φ2 pulse clocks may be provided to a logic arrangement 470a, 470b, ..., 470n, of a functional logic or unit block 430a, 430b, ..., 430n, of the integrated circuit 400. Of course, the specific rate of the fast φ1 and φ2 pulse clocks at each functional unit block 430a, 430b, ..., 430n, may be adjusted to correspond to the particular timing requirements of the corresponding logic arrangements 470a, 470b, ..., 470n, in each of the functional unit blocks 430a, 430b, ..., 430n.

A more detailed schematic of the controllable pulse-clock-delay system 100 is shown in or in FIG. 7. In particular, the control line and input buffer block 109 includes a MOSFET-device inverter buffer 294, a MOSFET-device stretch inverter buffer 129 on the first delay control line (delay 1#) 151, and a MOSFET-device inverter buffer 125 on the second delay control line (delay 2#) 152, each of which comprises a pull-down NMOSFET-device and a pull-up PMOSFET coupled in series. In the controllable pulse-clock-delay system 100, a fast φ1 input pulse clock terminal 153 is used to receive the fast φ1 input pulse clock signal from a fast φ1 input pulse clock buffer, which may be a variable width pulse clock generator as discussed above. In particular, the fast φ1 input pulse clock signal may be any appropriate pulse clock signal and may, for example, have a rising edge that occurs after three logic gate inversions and a falling edge that occurs after eight gate inversions.

Accordingly, the width of the pulse clock may be, for example, on the order of about five (5) logic gate inversion times, which may be on the order of about 275 picoseconds depending on various factors, including the nature of the integrated circuit arrangement, such as the types of transistor devices and materials used. Also, as discussed, the width of the pulse clock of the fast φ1 input pulse clock may vary depending on the particular logic and timing requirements of its associated logic arrangement 470a, 470b, ..., 470n, and corresponding functional unit block 430a, 430b, ..., 430n.

The controllable pulse-clock-delay device block 120 of FIG. 6 includes three controllable "NMOSFET-type" pulse clock delay devices 283, 281 and 282 and two controllable "PMOSFET-type" pulse clock delay devices 122 and 123, which are arranged in series in an alternating fashion, as is shown in FIG. 7. The controllable pulse-clock-delay device block 120 of FIG. 6 also includes a PMOSFET device 110 and an NMOSFET device 112, the gates of which are coupled to the inverted output of the controllable NMOSFET-type inverter delay device 282. The PMOSFET-device 110 and the NMOSFET-device 112 are coupled in series so as to form an output buffer, which outputs the fast φ2 output pulse clock, which is controllably delayed with respect to the fast φ1 input pulse clock signal, at the fast φ2 output pulse clock terminal 154. As discussed, the phase delayed φ2 output pulse clock signal is also fed back or input to the φ2 output pulse clock feedback block 130 of FIG. 6. The φ2 output pulse clock feedback block 130 also receives the fast φ1 input pulse clock input signal from the φ1 input pulse clock input terminal.

More particularly, the φ2 output pulse clock feedback block 130 includes a φ1 input pulse clock MOSFET-device inverter buffer 182, an output φ2 output pulse clock MOSFET-device inverter buffer 181 and a tri-state "PMOSFET-type" inverter buffer 180. The tri-state PMOSFET-type inverter buffer 180 is coupled between the φ2 output pulse clock terminal 154 (and the MOSFET-device inverter buffer 181) and the (φ1 input pulse clock MOSFET-device inverter buffer 182, which is coupled to the fast φ1 input pulse clock terminal 153. In particular, the φ1 input pulse clock MOSFET-device inverter buffer 182 buffers the fast φ1 input pulse clock signal to a "lower" NMOSFET-device (not shown) of the tri-state PMOSFET-type inverter buffer 180 through a coupling node n307. Also, the φ2 output pulse clock MOSFET-device inverter buffer 181 buffers the fast φ2 output pulse clock signal at output terminal 154 to an input node n310 of the tri-state PMOSFET-type inverter buffer 180. Although not shown, the tri-state PMOSFET-type inverter buffer 180 comprises a pair of PMOSFET devices in series and a pair of NMOSFET devices in series, and each of these MOSFET-device pairs are arranged in parallel to one another. Additionally, the output node n307 of the tri-state PMOSFET-type inverter buffer 180 is coupled to a controlling node n300 of each of the controllable NMOSFET-type pulse clock delay devices 281, 282 and 283. Also, the tri-state PMOSFET-type inverter buffer 180 has an inverting gate 180a, which receives the un-buffered fast φ1 input pulse clock signal from the input terminal 153, and a gate 180b, which receives the buffered and delayed fast φ1 input pulse clock signal through the MOSFET-device inverter buffer 182.

Also, the φ2 output pulse clock feedback block 130 of FIG. 6 may "lock" in a time that is on the order of about one to two clock cycles. To reduce the amount of clock jitter, however, another feedback arrangement may be used to provide a longer "lock" time, which may be, for example, something on the order of about twenty to thirty clock cycles.

As regards, the clock stretch and reset feedback block 140, this feedback arrangement includes a MOSFET-device NAND gate 287, a MOSFET-device inverter buffer 298, a PMOSFET transistor 279, a controllable NMOSFET-type pulse clock delay device 297, and a loading NMOSFET transistor 117 and a loading NMOSFET transistor 126. The loading NMOSFET transistors 117 and 126 are intended to add loading to the MOSFET-device inverter buffer 298 and to the controllable NMOSFET-type pulse clock delay device 297. This is intended to maintain a relatively constant delay as the output load changes and to avoid the use of relatively small MOSFET devices, which may result in a current underflow condition and a delay that is not relatively constant. It is also believed that such current conditions may occur, for example, when the controllable NMOSFET-type pulse clock delay device 297 and the PMOSFET-device inverter buffer 298 have sufficiently fast loading capacitances. In such a case, the loading PMOSFET transistors 117 and 126 are used to "slow down" the loaded MOSFET devices. As further regards the loading PMOSFET transistor 117, it is coupled through a coupling node n309 to an output of the controllable NMOSFET-type pulse clock delay device 297 and to an input of the MOSFET-device inverter buffer 298. Also, a stretch control line MOSFET-device inverter buffer 294 is used to buffer and couple a stretch control signal of the stretch control line 150 to the clock stretch and reset feedback block 140 of FIG. 6.

As to the testing of a functional unit block 430a, 430b, . . . , 430n, on the integrated circuit 400, the digital control lines, namely the stretch control line 150, the first delay control line (delay #1) 151 and the second delay control line (delay #2) 152 may be used with different direct current level voltages to assess or test system performance based on, for example, variations in MOSFET device characteristics or expected operating conditions. As regards the clock stretch control line 150, it is coupled through a PMOSFET buffer inverter 294 to a coupling node n303. The coupling node n303 is coupled to and drives a lower NMOSFET-device (not shown) of the controllable NMOSFET-type pulse clock delay device 297. The stretch control line 150, the first delay control line (delay #) 151 and the second delay control line (delay #2) 152 may be coupled to the supply voltage (Vcc or Vdd) using, for example, voltage drop resistors, fuse arrays or any other suitably appropriate technique. Of course, if the digital control lines 150 to 152 are not used, then standard inverter devices may be used for the delay devices 122 and 123.

Figure 8B:
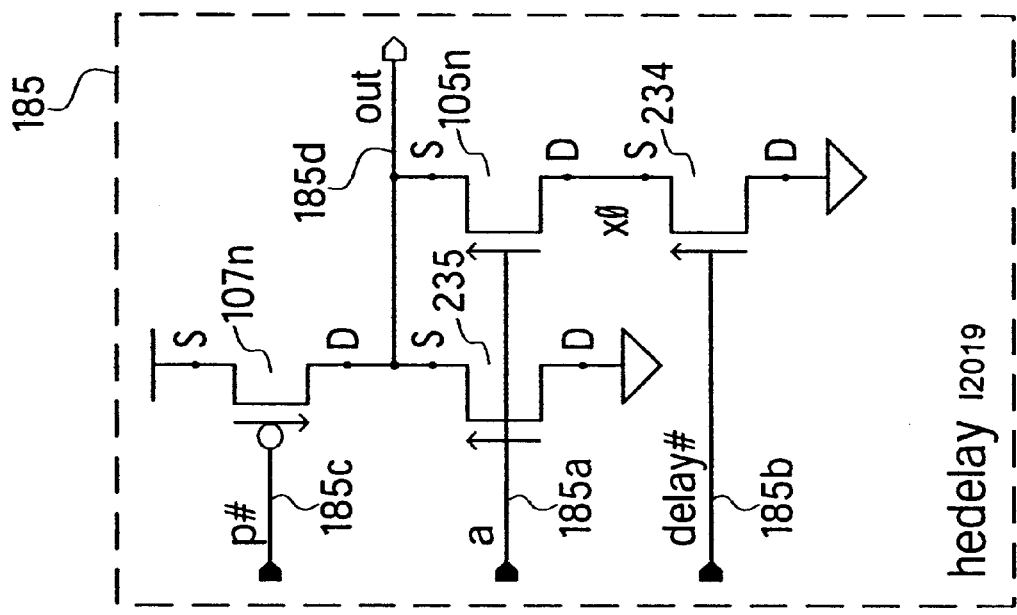
FIG. 8B shows a schematic of an NMOSFET-type controllable delay device for use with the MOSFET device-based controllable pulse delay circuit arrangement of FIG. 6 and FIG. 7.
Figure 8A:
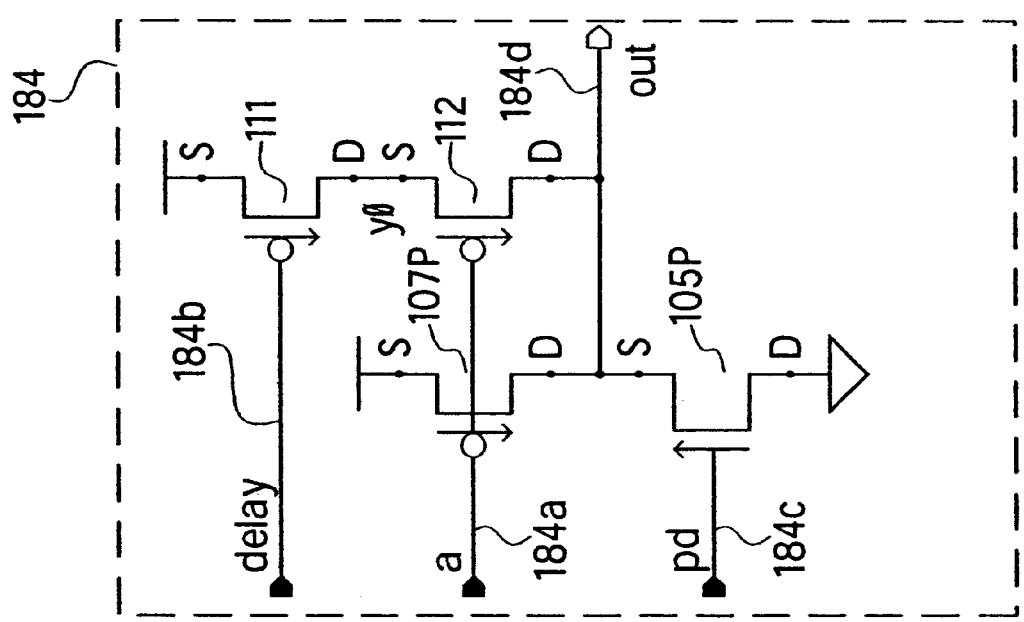
FIG. 8A shows a schematic of a PMOSFET-type controllable delay device for use with the MOSFET device-based controllable pulse-clock-delay circuit arrangement of FIG. 6 and FIG. 7.

The specific MOSFET-device layout and structure of each of the controllable PMOSFET-type pulse clock delay devices 122 and 123 is shown in FIG. 8A. In particular, a "delay" terminal 184b is coupled to a gate of a PMOSFET-device 111. The source terminal of the PMOSFET-device 111 is coupled to a supply voltage (Vcc or Vdd) and its drain terminal is coupled in series to a source terminal of a PMOSFET-device 112. A drain terminal of the PMOSFET-device 112 is coupled to an output terminal 184d of the controllable NMOSFET-type pulse clock delay device 184. Additionally, a pulse clock input terminal (terminal "a") 184a is coupled to a gate terminal of the PMOSFET-device 112 and to a gate terminal of a PMOSFET-device 107p, a source terminal of which is coupled to the supply voltage (Vcc or Vdd), and a drain terminal of which is also coupled to the output terminal 184d and to the drain terminal of the PMOSFET-device 112. Finally, a gate terminal of an NMOSFET-device 105p is coupled to a "pd" control terminal 184c of the controllable PMOSFET-type pulse clock delay device 184. A source terminal of the PMOSFET-device 105p is coupled to drain terminals of the PMOSFET-devices 107p and 112 and to the output terminal 184d, and a drain terminal of the PMOSFET-device 105p is coupled to relative ground (ground or Vss).

The specific MOSFET-device layout and structure of each of the controllable NMOSFET-type pulse clock delay devices 281, 282 and 283 is shown in FIG. 8B. In particular, a controllable NMOSFET-type pulse clock delay device 185 includes NMOSFET-devices 105n, 234 and 235 and a PMOSFET-device 107n. A "p#" control terminal 185c is coupled to a gate of the PMOSFET 107n. A source terminal of the PMOSFET 107n is coupled to the supply voltage (Vcc or Vdd), and its drain terminal is coupled to an output terminal 185d of the controllable NMOSFET-type pulse clock delay device 185. Also, an input terminal (terminal "a") 185a of the controllable NMOSFET pulse clock delay device 185 is coupled to a gate of an NMOSFET-device 235, which has a drain terminal that is coupled to a relative ground (ground or Vss). The input terminal 185a is also coupled to a gate of the NMOSFET-device 105n. The NMOSFET-device 105n is coupled in series by its drain terminal to a source terminal of the NMOSFET-device 234. Finally, a "delay #" control terminal 185b is coupled to a gate terminal of the NMOSFET-device 234, a drain terminal of which is coupled to a relative ground (ground or Vss).

As regards the operation of the controllable pulse-clock-delay system 100, the first delay control line (delay 1#) 151 and the second delay control line (delay 2#) 152 may be used to adjust or control digitally the amount of phase delay in the fast $\phi 2$ output pulse clock with respect to the fast $\phi 1$ input pulse clock, but without regard to the frequency of the input or reference clocks. In particular, the phase delay or phase shift may be increased (or decreased) so that the fast $\phi 2$ output pulse clock does not arrive before (or too long after) the data that is to be clocked by the fast $\phi 2$ output pulse clock signal in the logic arrangement 470a, 470b, . . . , 470n, of the functional unit block 430a, 430b, . . . , 430n. This is because if the fast $\phi 2$ output pulse clock arrives before the data in the corresponding data path of the associated logic arrangement 470a, 470b, . . . , 470n, then the data may "race" through the corresponding latch or sense amplifier arrangement before it is properly latched or sensed, thereby resulting in corrupted or "lost" data. Likewise, if the fast $\phi 2$ output pulse clock arrives after the data, then system processing time may be wasted unnecessarily. The first delay control line (delay 1#) 151 and the second delay control line (delay 2#) 152 may be used during testing of the associated functional unit block 430a, 430b, . . . , 430n, of the integrated circuit 400 to determine its timing failure point. The timing failure point should occur when the delay may be sufficiently short so as to cause a data failure (which may mean a corrupted or lost data signal) because the fast $\phi 2$ output pulse clock is arriving before the data signal is able to arrive at the latch or sense amplifier arrangement at the end of the corresponding data path in the logic arrangement 470a, 470b, . . . , 470n, of the functional unit block 430a, 430b, . . . , 430n.

As regards the use of the frequency of the input clock signal to control the phase delay or shift of the output pulse clock signal in the controllable pulse-clock-delay system 100, if an input clock is slowed down so as to decrease the clock frequency, this should provide for increased race margins in the system. Likewise, if the input clock frequency is increased, this should reduce the corresponding race margin in the system. In this regard, the tri-state PMOSFET-type inverter buffer 180 is intended to operate so as to detect the phase or timing of the fast $\phi 2$ output pulse clock signal with respect to the fast $\phi 1$ input pulse clock signal. Thus, if the fast φ1 input pulse clock signal arrives before the fast φ2 output pulse clock signal, then the tri-state PMOSFET-type inverter buffer 180 outputs or provides a different voltage to the feedback control node n300. The feedback control node n300 is coupled to each of the controllable NMOSFET-type pulse clock delay devices 281, 282 and 283.

Thus, for shorter width pulse clock signals, the output voltage of the tri-state PMOSFET-type inverter should buffer 180 should approach the supply voltage (Vcc or Vdd), so as to reduce the phase delay of the fast φ2 output pulse clock. Likewise, for longer width pulse clock signals, the output voltage of the tri-state PMOSFET-type inverter should buffer 180 should approach the relative ground (ground or Vss) so as to increase the phase delay of the fast φ2 output pulse clock signals. Accordingly, as the output voltage of the tri-state PMOSFET-type inverter buffer 180 varies between the supply voltage (Vcc or Vdd) and relative ground (ground or Vss), the phase delay or phase shift in the fast φ2 output pulse clock signal should also vary. In this way, shorter widths of the input pulse clock signal should provide increased delays or phase shifts in the output pulse clock signal, and longer widths of the input pulse clock signal should provide shorter delays or phase shifts in the output pulse clock signal. The rate at which the voltage at the feedback control node n300 may change between the supply voltage and the relative ground may depend on any associated delay of the tri-state PMOSFET-type inverter buffer 180. That is, any associated delay of the tri-state PMOSFET-type inverter buffer 180 may affect the feedback gain of the timing detector operation of the fast φ2 output pulse clock feedback block 130.

As further regards the controllable NMOSFET-type pulse clock delay device 281, its PMOSFET-device (PMOSFET-device 107*n* of FIG. 8B) is coupled to a node n306 of the clock reset and stretch feedback block 140. In particular, the PMOSFET-device of the controllable NMOSFET pulse clock delay device 281 is coupled to an inverted output of the NAND gate 287. The clock reset and stretch feedback block 140 provides a self-resetting loop that affects or determines, at least in part, the pulse width of the fast φ2 output pulse clock signal. The clock reset and stretch feedback block 140 does not, however, determine the phase delay or phase shift in the fast φ2 output pulse clock signal. In the remainder of the controllable pulse-clock-delay device block 120, the controllable NMOSFET-type pulse clock delay device 283 provides a logic or gate inversion on its NMOSFET-device "side". The controllable PMOSFET-type pulse clock delay device 122 also provides a logic or gate inversion, and is controlled by the second delay control line (delay #2) 152. Also, the controllable PMOSFET-type pulse clock delay device 123 provides a logic or gate inversion, and is controlled by the first delay control line (delay 1#) 151.

Since only one clock edge (whether rising or falling) of a reference clock is used to trigger a pulse clock, each of the controllable NMOSFET-type pulse clock delay devices 281, 282 and 283 only provide a logic or gate inversion delay if the controllable NMOSFET-type pulse clock delay device is pulled down by the voltage at the feedback control node n300, which is input to the "delay #" terminal 185*b* of the gate of the lower NMOSFET-device 234 of the controllable NMOSFET-type pulse clock delay device 185 of FIG. 8B. Likewise, each of the controllable PMOSFET-type pulse clock delay devices 122 and 123 only provides a logic or gate inversion delay if the controllable PMOSFET-type pulse clock delay device is pulled up by the delay control lines 152 and 151, respectively, which is input to the gate of the delay terminal 184*b* of the upper PMOSFET-device 111 of the controllable PMOSFET-type pulse clock delay device 184 of FIG. 8A.

The fast φ2 output pulse clock is generated or triggered off of the rising clock edge (or first clock edge, whether rising or falling) of the fast φ1 input pulse clock based on the self-resetting operating feature of the clock stretch and reset feedback block 140. Because of the fast φ1 input pulse clock, the controllable PMOSFET-type pulse clock delay device 281 is reset by the output voltage at a node n306 of the NAND gate 287. The drain terminal of the PMOSFET-device transistor 279 is coupled to an output node n308 of the controllable NMOSFET-type pulse clock delay device 281, and its gate terminal is coupled to a node 316 and it is therefore affected by the output of the controllable PMOSFET-type pulse clock delay device 123. In this way, after the completion of φ1 input pulse clock, the node n308 should be kept high by the pull-up PMOSFET transistor 279 so that node n308 does not float. In particular, after an output node n319 of the controllable PMOSFET-type pulse clock delay device 122 goes to its high logic state, then the output node n308 of the controllable NMOSFET-type pulse clock delay device 281 should be driven to its low logic state, This causes the controllable PMOSFET-type pulse clock delay device 128 to output a low logic level at its output node n316. Accordingly, the output node n306 of NAND gate 287 should be driven to its low logic state when input node n316 is high and an input node n317, which is driven by controllable NMOSFET-type pulse clock delay device 297 through the PMOSFET-device inverter buffer 298 (the output of which is the node n317) is also driven to its high logic state.

As further regards the clock stretch and reset block 140, it may be considered as providing five (5) logic or gate inversions that control the width of the pulse (in contrast, the controllable pulse-clock-delay device block 120 uses six (6) logic or gate inversions to control the delay from input pulse clock to the output pulse clock). In this way, when a coupling node n309 is driven to a low logic state (and the coupling node n316 is in a low logic state), this should cause the NAND gate 287 to drive the output node n306 to a low logic state. This should cause the output node n308 of the controllable NMOSFET delay device 281 to be driven to a high logic level. This provides the reset feature of the clock stretch and reset block 140. Also, when the coupling node n308 is low, this should turn on the PMOSFET-device 279. After the PMOSFET-device 279 turns on, the supply voltage (Vcc or Vdd) should pull the coupling node n308 to its high logic state. This is because after the node n316 is driven to its low logic state, the output node n306 of the NAND gate 287 should be driven to its high logic state, which should turn off the PMOSFET-device of the controllable NMOSFET-type pulse clock delay device 281 so that the coupling node n308 is no longer being driven to its high logic state. Accordingly, the PMOSFET-device 279 drives or pulls the node n308 to its high logic state and keeps it there so long as the node n316 is in its low logic state. Otherwise, if the fast φ1 input pulse clock were stopped, then the node n308 might float rather than being kept at an appropriate logic level or state. In this way, the clock stretch and reset block 140, which includes the NAND gate 287, is used to provide a three-five reset arrangement, which has three input inversions, which determines when the PMOSFET devices are turned off so as to allow the next clock cycle, and five output inversions, which determines the width of the pulse, so as to reduce any power contention state by two inversions. This is because three logic or gate inversions are used to turn off the fast φ1 input pulse clock (using the controllable NMOSFET-type pulse clock delay device 281), and five logic or gate inversions are used to turn on the fast φ1 input pulse clock. In this way, the fast φ1 input pulse clock may be turned off earlier so that the next input pulse clock may turn on sooner by two logic or gate inversion periods.

Although, the controllable pulse-clock-delay system 100 has been discussed with respect to MOSFET device technology, as well as "pseudo" two-phase pulse-passgate-logic or low-voltage-swing logic arrangements, it may be used with any suitably appropriate two-phase self-timed clock arrangement, using full voltage swing circuit arrangements or other transistor technologies where appropriate. In this way, the race or timing margins may be adjusted digitally by using the stretch and delay control lines 150, 151 and 152 of the optional control line and input buffer block 109 to control the width of the fast φ2 output pulse clock and by using the φ2 output pulse clock feedback block 130 to determine the phase of the fast φ2 output pulse clock. Also, to better avoid any problems associated with MOSFET device mismatch, it is believed that, where appropriate, the controllable pulse-clock-delay system 100 should be provided locally with respect to each functional unit block 430a, 430b, . . . , 430n, of the integrated circuit 400, as discussed above.

What is claimed is:

1. An apparatus for buffering at least one output signal of a sense-amplifier arrangement for use with a first output and at least a second output of at least one of a propagate-generate-kill logic circuit and a domino logic circuit, the first output and the at least a second output being mutually exclusive in one logic state, the apparatus comprising:
   a cross-coupled transistor arrangement;
   wherein:
      the at least one output signal of the sense-amplifier arrangement is coupled to the at least one of the propagate-generate-kill logic circuit and the domino logic circuit; and
      the first output and the at least a second output of the at least one of the propagate-generate-kill logic circuit and the domino logic circuit are coupled to the cross-coupled transistor arrangement for holding the first output and the at least a second output in another logic state.

2. The apparatus of claim 1, wherein the cross-coupled transistor arrangement includes:
   a first transistor having a first gate and a first terminal;
   at least a second transistor having a second gate and a second terminal,
   wherein the first gate and the second terminal are adapted to be coupled to the first output, and the first terminal and the second gate are adapted to be coupled to the at least a second output.

3. The apparatus of claim 2, wherein each of the transistors is a MOSFET.

4. The apparatus of claim 2, wherein each of the transistors is an NMOSFET.

5. The apparatus of claim 2, wherein each of the transistors is a PMOSFET.

6. The apparatus of claim 5, wherein each of the terminals is a drain.

7. The apparatus of claim 1, wherein the at least one of the propagate-generate-kill logic circuit and the domino logic circuit includes the propagate-generate-kill logic circuit.

8. A buffer apparatus for use with a first output, a second output and at least a third output of a logic circuit, in which the first output, the second output and the at least a third output are mutually exclusive, the apparatus comprising:
   a first transistor having a first gate and a first terminal;
   a second transistor having a second gate and a second terminal;
   a third transistor having a third gate and a third terminal;
   a fourth transistor having a fourth gate and a fourth terminal;
   a fifth transistor having a fifth gate and a fifth terminal;
   at least a sixth transistor having a sixth gate and a sixth terminal,
   wherein the first output is coupled to the first terminal and the second terminal and the fourth gate and the sixth gate, the second output is coupled to the fifth gate and the third terminal and the fourth terminal, and the third output is coupled to the first gate and the third gate and the fifth terminal and the sixth terminal.

9. The apparatus of claim 8, wherein each of the transistors is a MOSFET.

10. The apparatus of claim 8, wherein each of the transistors is an NMOSFET.

11. The apparatus of claim 8, wherein each of the transistors is a PMOSFET.

12. The apparatus of claim 11, wherein each of the terminals is a drain.

13. The apparatus of claim 8, wherein the logic circuit is at least one of a propagate-generate-kill logic circuit and a domino logic circuit.

14. A buffer apparatus for at least one output signal of a sense-amplifier arrangement for use with a first output and at least a second output of at least one of a propagate-generate-kill logic circuit and a domino logic circuit, the first output and the at least a second output being mutually exclusive in one logic state, the buffer apparatus comprising:
   a cross-coupled transistor MOSFET arrangement;
   wherein:
      the cross-coupled transistor arrangement includes:
         a first transistor having a first gate and a first terminal; and
         at least a second transistor having a second gate and a second terminal, the first gate and the second terminal are adapted to be coupled to the first output, and the first terminal and the second gate are adapted to be coupled to the at least a second output;
      the at least one output signal of the sense-amplifier arrangement is coupled to the at least one of the propagate-generate-kill logic circuit and the domino logic circuit; and
      the first output and the at least a second output of the at least one of the propagate-generate-kill logic circuit and the domino logic circuit are coupled to the cross-coupled transistor arrangement for holding the first output and the at least a second output in another logic state and for providing a voltage noise bump immunity for an output of the sense-amplifier arrangement.

15. The apparatus of claim 14, wherein the at least one of the propagate-generate-kill logic circuit and the domino logic circuit includes the propagate-generate-kill logic circuit.

16. The apparatus of claim 14, wherein the at least one sense-amplifier arrangement is at least one of a dual PMOSFET sense-amplifier arrangement, a differential PMOSFET sense-amplifier arrangement, an NMOSFET sense-amplifier arrangement, and a single-ended NMOSFET sense-amplifier arrangement.

17. The apparatus of claim 15, wherein the at least one sense-amplifier arrangement is at least one of a dual PMOS- FET sense-amplifier arrangement, a differential PMOSFET sense-amplifier arrangement, an NMOSFET sense-amplifier arrangement, and a single-end NMOSFET sense-amplifier arrangement.

18. A buffer and gain system comprising:

a sense-amplifier arrangement;

a logic gate loading arrangement;

at least one of a propagate-generate-kill logic arrangement and a domino logic arrangement having a first output and at least a second output, each of the outputs being mutually exclusive outputs in one logic state, the logic arrangement being coupled between the sense-amplifier arrangement and the logic gate loading arrangement;

a cross-coupled transistor arrangement coupled between the at least one of the propagate-generate-kill logic arrangement and the domino logic arrangement and the logic gate loading arrangement and including a first transistor having a first gate and a first terminal and at least a second transistor having a second gate and a second terminal wherein:

the first gate and the second terminal are adapted to be coupled to the first output, and the first terminal and the second gate are adapted to be coupled to the at least a second output; and the cross-coupled transistor arrangement is for holding the first output and the at least a second output in another logic state and for providing a voltage noise bump immunity for an output of the sense-amplifier arrangement.

19. The system of claim 18, wherein the sense-amplifier arrangement is one of a MOSFET-device sense amplifier arrangement, a differential MOSFET-device sense amplifier arrangement and a single-ended MOSFET-device sense amplifier arrangement.

20. The system of claim 19, wherein each of the MOSFET-device sense amplifier arrangements includes at least one of a PMOSFET and an NMOSFET.

21. The system of claim 19, wherein the logic arrangement is at least one of a domino logic arrangement and a complementary domino logic arrangement.

22. The system of claim 19, wherein the logic arrangement is at least one of a full-swing logic arrangement, a threshold-voltage swing logic arrangement and a low-voltage-swing logic arrangement.

23. The system of claim 19, wherein the logic gate loading arrangement is at least one of a static logic arrangement and a ratioed logic arrangement.

24. The apparatus of claim 1, wherein the at least one of the propagate-generate-kill logic circuit and the domino logic circuit includes the domino logic circuit.

25. The buffer apparatus of claim 8, wherein the logic circuit includes the domino logic circuit.

26. The buffer apparatus of claim 8, wherein the logic circuit includes the propagate-generate-kill logic circuit.

27. The buffer apparatus of claim 14, wherein the at least one of the propagate-generate-kill logic circuit and the domino logic circuit includes the domino logic circuit.

28. The buffer and gain system of claim 18, wherein the at least one of the propagate-generate-kill logic arrangement and the domino logic arrangement includes the propagate-generate-kill logic arrangement.

29. The buffer and gain system of claim 18, wherein the at least one of the propagate-generate-kill logic arrangement and the domino logic arrangement includes the domino logic arrangement.

* * * * *